(12) United States Patent
Ogata et al.

(10) Patent No.: US 7,575,442 B2
(45) Date of Patent: Aug. 18, 2009

(54) MULTILAYER WIRING SUBSTRATE

(75) Inventors: Eiji Ogata, Fukuoka (JP); Kazunori Omori, Fukuoka (JP); Koichi Namimatsu, Fukuoka (JP); Kazunari Fukagawa, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/076,014

(22) Filed: Mar. 12, 2008

(65) Prior Publication Data

US 2008/0227312 A1 Sep. 18, 2008

(30) Foreign Application Priority Data

Mar. 16, 2007 (JP) .............................. 2007-068691

(51) Int. Cl.
*H01R 12/06* (2006.01)
(52) U.S. Cl. ..................................... 439/75
(58) Field of Classification Search ................... 439/75; 438/637, 638, 640, 613; 257/737, 738, 780; 29/847, 853, 829; 361/792–795
See application file for complete search history.

(56) References Cited

U.S. PATENT DOCUMENTS

| 7,263,769 | B2* | 9/2007 | Morimoto et al. | 29/852 |
| 7,342,183 | B2* | 3/2008 | Egitto et al. | 174/262 |
| 2004/0195002 | A1* | 10/2004 | Higuchi et al. | 174/267 |
| 2006/0102386 | A1* | 5/2006 | Morimoto et al. | 174/260 |
| 2008/0017409 | A1* | 1/2008 | Takeuchi et al. | 174/260 |

FOREIGN PATENT DOCUMENTS

JP 2006-140365 6/2006

\* cited by examiner

*Primary Examiner*—Alexander Gilman
(74) *Attorney, Agent, or Firm*—Staas & Halsey LLP

(57) ABSTRACT

A first wiring pattern formed on a first layer of a multilayer wiring substrate, a second wiring pattern formed on a layer different from the first layer on which the first wiring pattern is formed, a penetration hole penetrating the front surface and the back surface of the substrate, and a penetration hole penetrating a front surface and a back surface of the substrate; and a fitting connector having a conductor part on a side surface inscribed in the penetration hole and fitting into the penetration hole are provided. The first wiring pattern and the second wiring pattern are exposed from the internal surface of the penetration hole, and the fitting connector connects a first end part of the conductor part and a second end part with an exposed part of the first wiring pattern and an exposed part of the second wiring pattern, respectively.

8 Claims, 21 Drawing Sheets

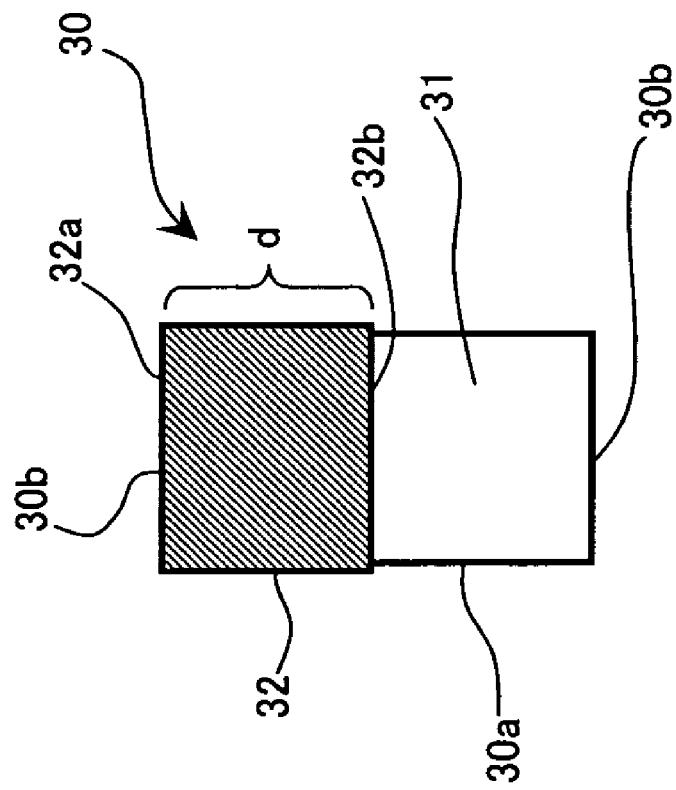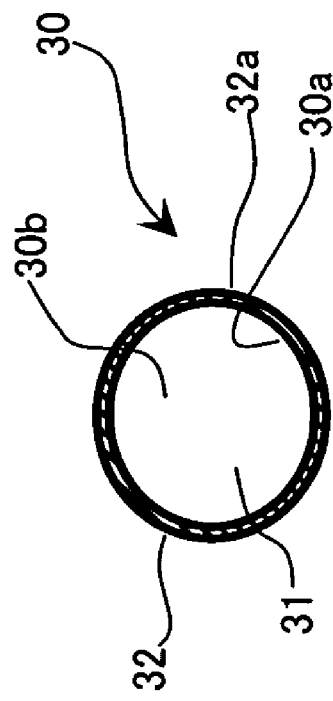
Fig. 2A
Fig. 2B

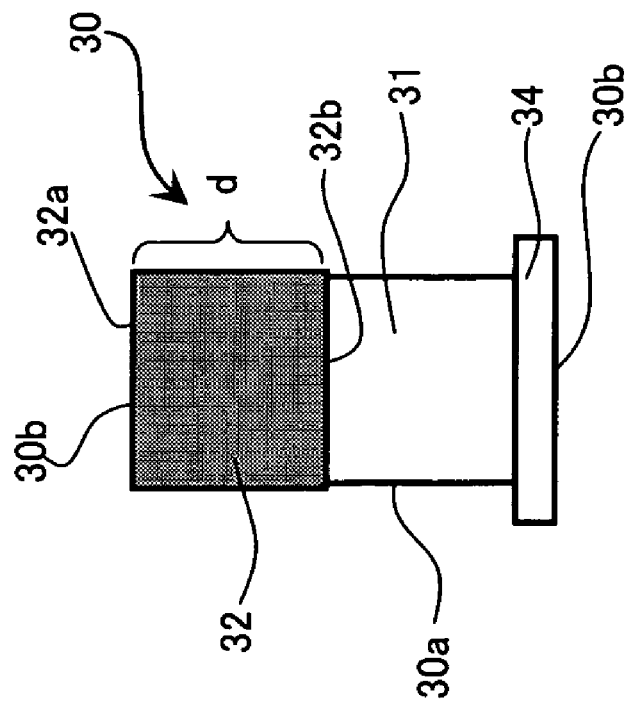
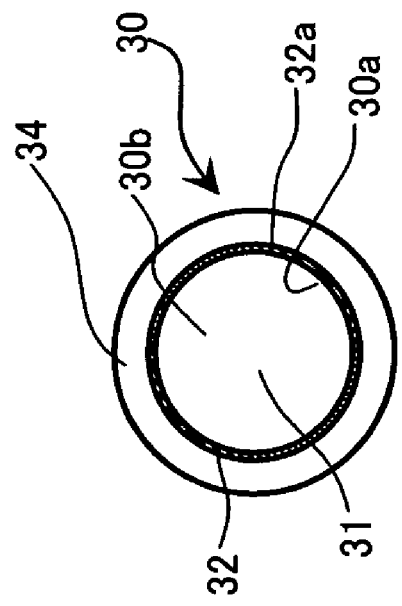
Fig. 5A
Fig. 5B

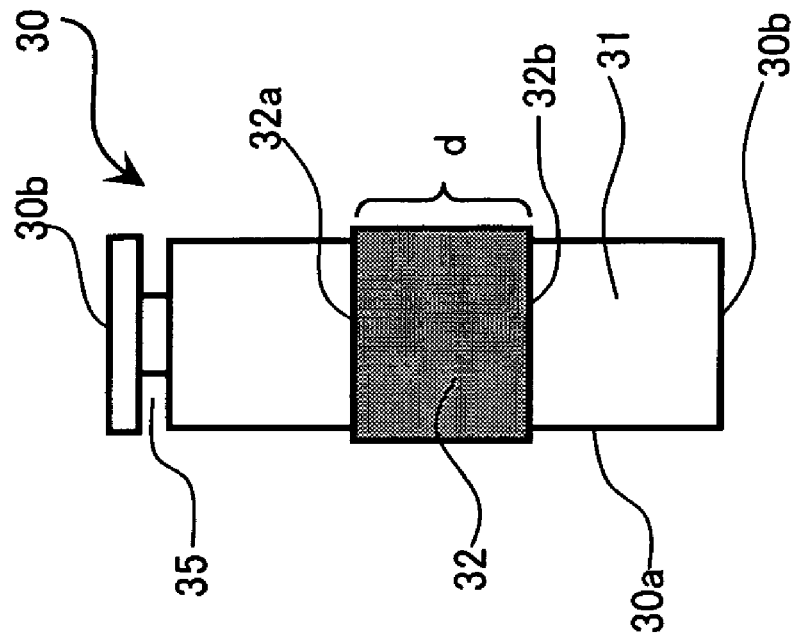
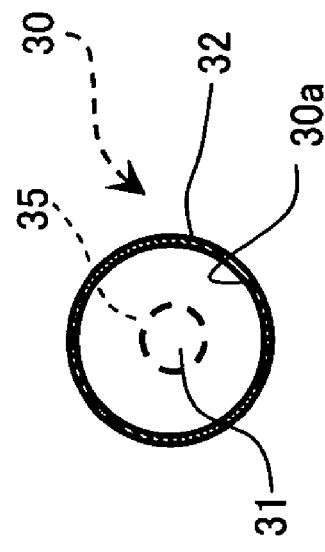
Fig. 6A
Fig. 6B

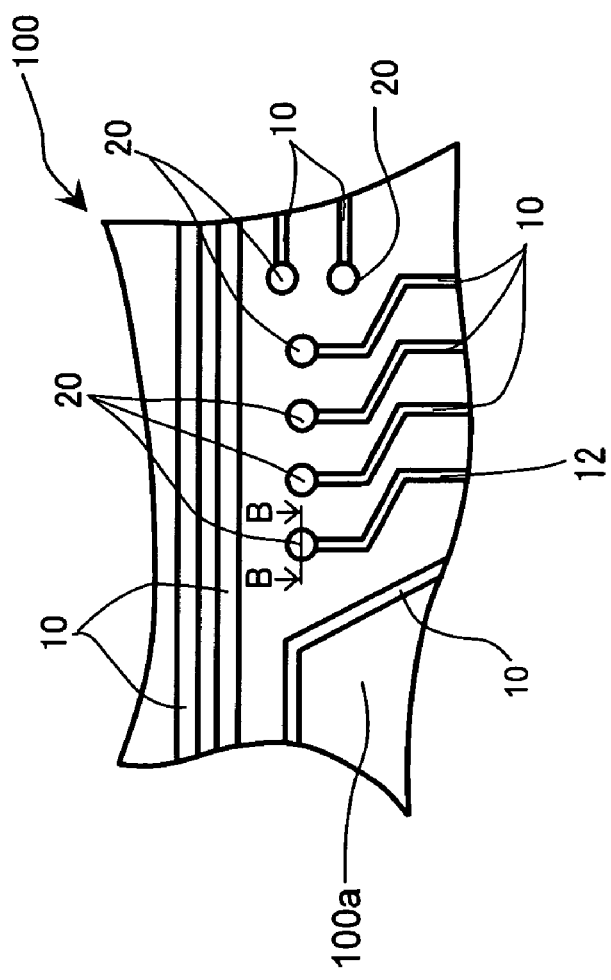
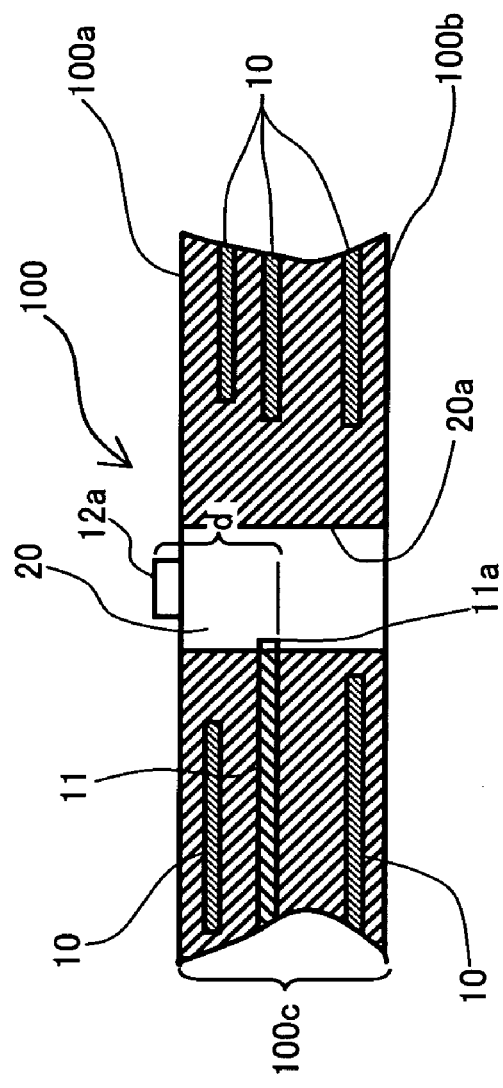
Fig. 9A
Fig. 9B

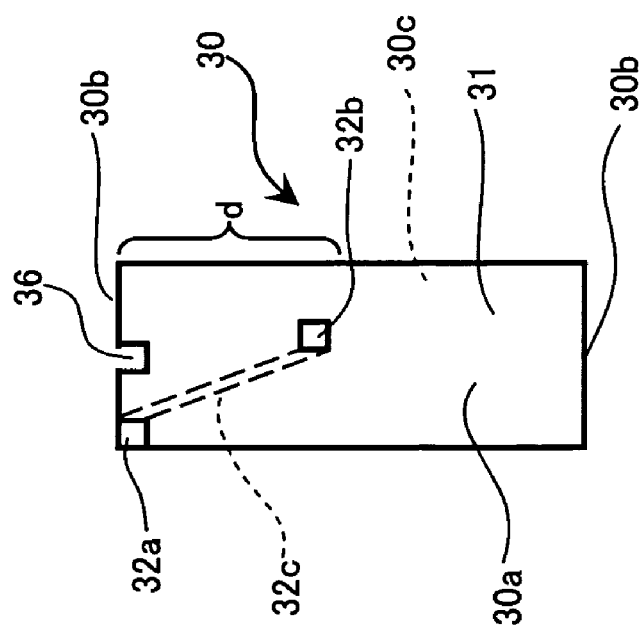
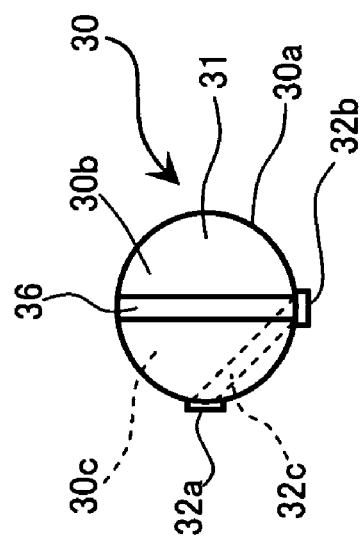
Fig. 10A
Fig. 10B

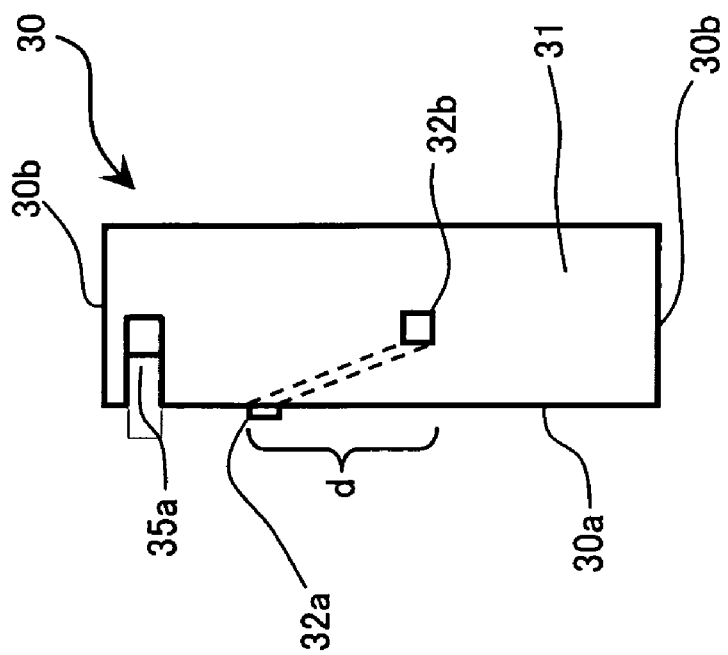
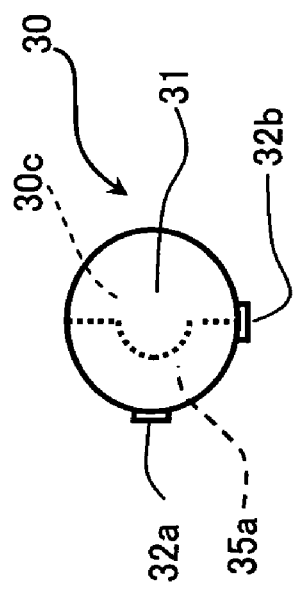
Fig. 12A
Fig. 12B

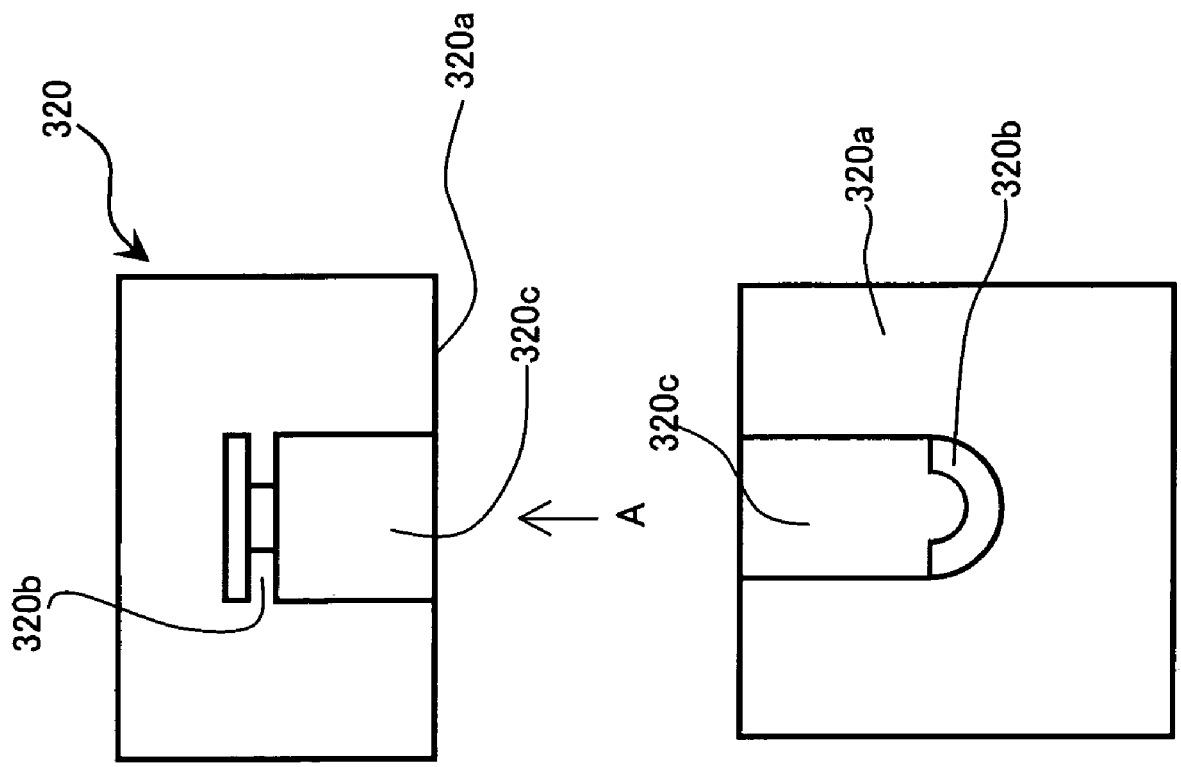

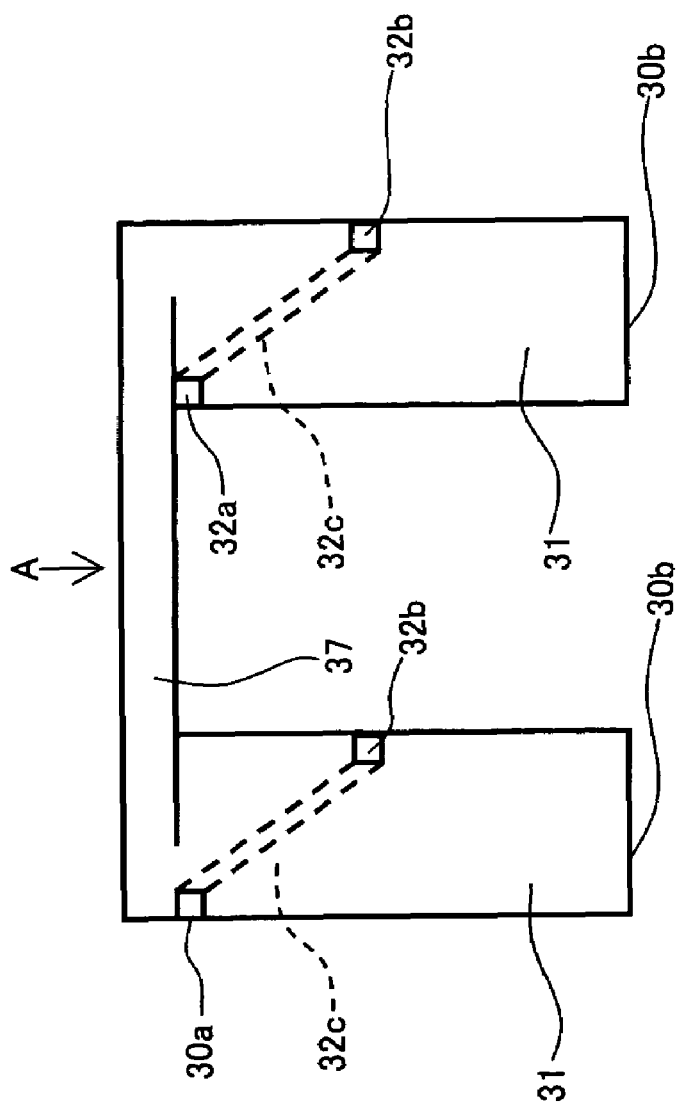
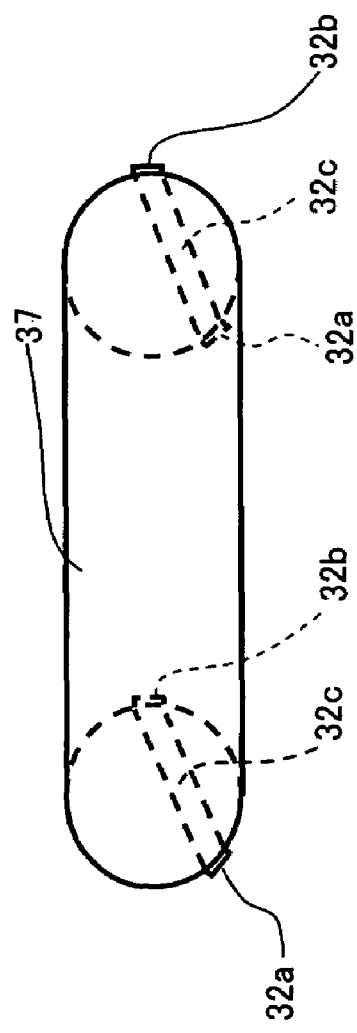
Fig. 15A
Fig. 15B

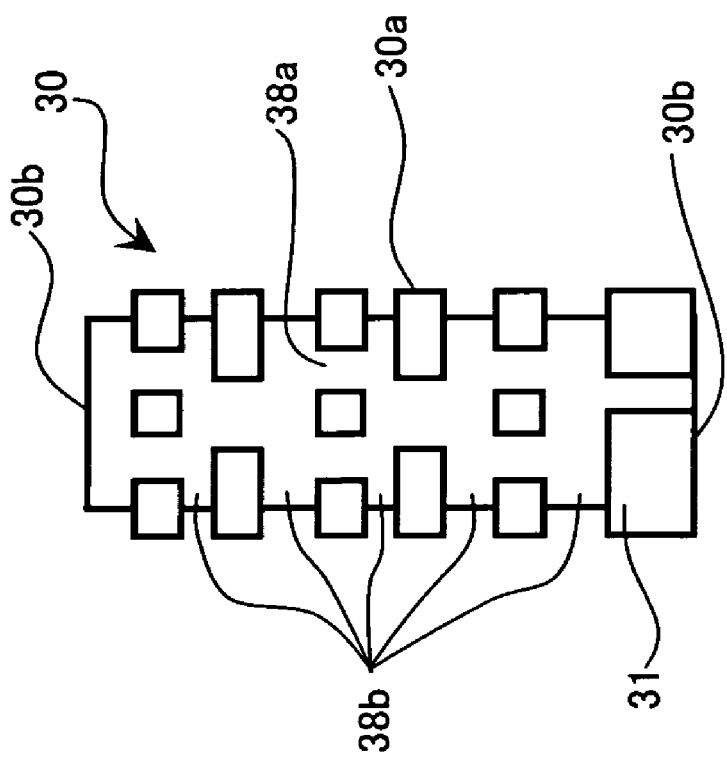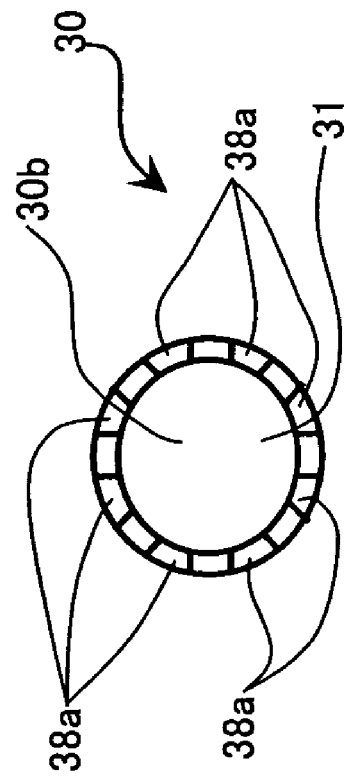
Fig. 16A
Fig. 16B

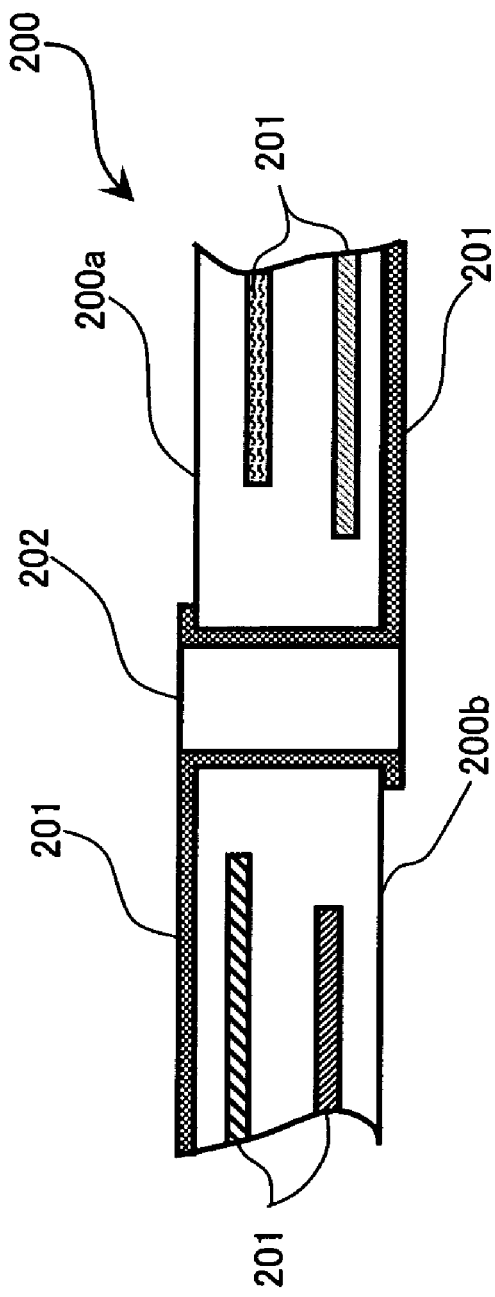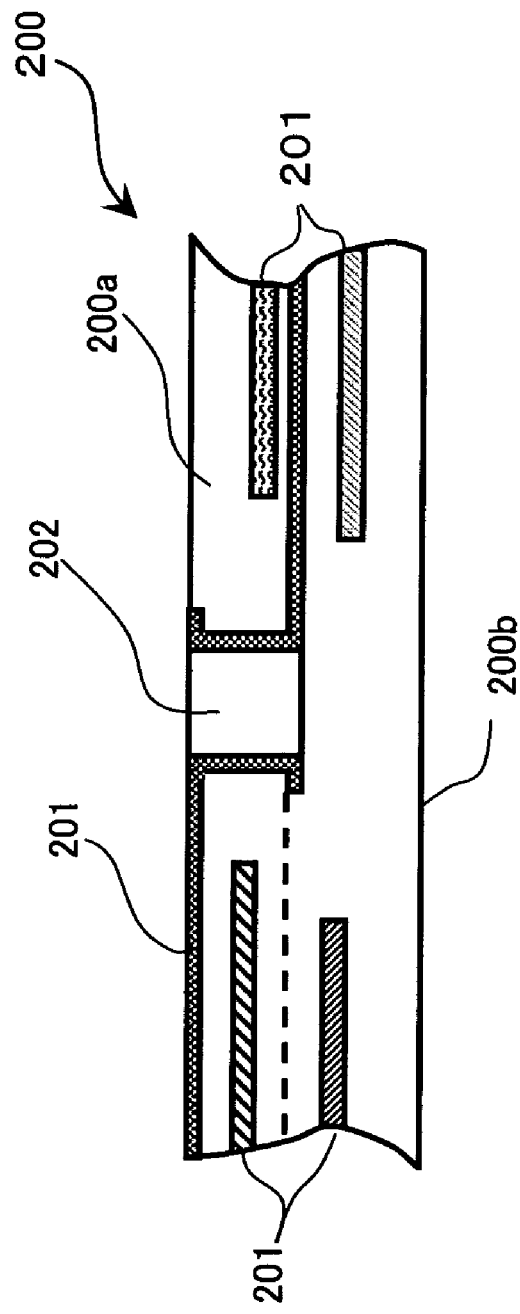

MULTILAYER WIRING SUBSTRATE

BACKGROUND OF THE INVENTION

1. Field of the Invention

This invention relates to a multilayer wiring substrate structure in which wiring patterns formed on respective layers of a multilayer wiring substrate are connected through a via, and more specifically, it relates to a multilayer wiring substrate structure in which high speed signals are transmitted through wiring patterns of a multilayer wiring substrate.

2. Description of the Related Art

In recent years, along with an increase in data transmission amount, a bandwidth beyond the Gbps level has been spread for realization of a higher speed of devices and high speed signal transmission. A wiring pattern formed on a printed-wiring substrate (hereinafter referred to as PWB) is used in common as a transmission path in a transmission apparatus and a system. Also, in order to ensure a transmission quality of the high speed signal wiring, various design methods are adopted for the device and the PWB.

For example, as the design method for the device, a method of adopting a device having a built-in function of a pre-emphasis, an equalizer, an OCD (Off Chip Driver), or an ODT (On Die Termination) is conceivable. Also, possible examples of the design method for the PWB include an decrease in dielectric loss and resistance loss by adopting a base material for a high frequency (a low dielectric loss tangent (tan δ), low dielectric constant (∈r), VLP (Very Low Profile) copper foil, a characteristic impedance matching, and an achievement of suppression in reflection and transmission loss (signal attenuation) by eliminating a branch of a VIA (an unnecessary part for signal transmission in the VIA) through an IVH (Interstitial Via Hole), build-up, or the like. It should be noted that in the following description, a length necessary for the signal transmission in the via is referred to as backbone length and a length of the via stab which is the unnecessary part for the signal transmission in the via is referred to as branch length.

Here, the reflection and the transmission loss due to the via stab are examined. First, regarding the reflection due to the via stab, the characteristic impedance is discontinuously generated due to the via stab and reflectivity coefficient and transmission coefficient are not 0, so that reflected waves are generated.

In addition, regarding the transmission loss due to the via stab, by varying various parameters such as a bit rate (reduction of an operation frequency), a characteristic impedance which depends on a thickness of the copper foil and a width of the wiring in the wiring pattern, a dielectric constant of the base material for the PWB, and an interlayer distance between adjacent wiring patterns, a property value of a raw material for the base material such as the dielectric loss tangent and the dielectric constant, a physical line length (a shape of a via stab depend on the backbone length and the branch length), and the like, the transmission loss (the signal attenuation) is determined.

This bit rate is determined as a specification for satisfying a condition for a targeted circuit operation in many cases, and it is basically impossible to change the bit rate. In particular, the demanded specification cannot be satisfied in the future, in a case where the specification of a set value of the bit rate is increased, as a dependence property of the frequency exists in the transmission loss, if a countermeasure for the transmission loss is not conducted through other parameters.

As the characteristic impedance depends on the property value of the substrate material which directly relates to a cost, although it is a principle way to design a matching circuit, the characteristic impedance can be realized by adjusting the respective physical parameters. Thus, the control is relatively easy.

In addition, the property value is determined in a trade-off relation with respect to the usage of a raw material having a more satisfactory characteristic for the base material.

Furthermore, regarding the via stab, the branch length varies depending on which layer the plural writing patterns connected through the via are arranged on. In a case of high density wirings, a freedom in design is lost and it is necessary to determine whether the transmission loss satisfies the permissive spec in consideration of the via stab. In particular, the transmission loss due to the via stab occupies a non-negligible ratio also in the entire wiring paths.

As described above, in order to ensure the transmission quality of the high speed signal wiring, the various design methods are adopted for the device and the PWB. However, if a safer margin is prepared, the countermeasure cost is of course tended to be increased. Thus, in actuality, the countermeasure is selected based on cost-benefit performance.

For this reason, the following convention technologies are proposed as a method of decreasing the branch length due to the interlayer connecting via, which is the non-negligible parameter related to the transmission loss. FIG. 19A is a cross-sectional view for describing a penetration via, FIG. 19B is a cross-sectional view for describing a half-penetration via, FIG. 20A is a cross-sectional view for describing the IVH, FIG. 20B is a cross-sectional view for describing the build-up, FIG. 21A is a cross-sectional view for describing a back drill before the back drill is performed, and FIG. 21B is a cross-sectional view for describing the back drill after the back drill is performed. In FIGS. 19 to 21, wiring patterns 201 straddling a plurality of layers formed on a front layer or an internal layer of a multilayer wiring substrate 200 are connected through a via 202. Also, in FIG. 21, a via stab 202a is still remained.

First, there is a conventional technology for providing a penetration via for interlayer connection as the backbone length of the via 202 between a front surface 200a and a back surface 200b of the multilayer wiring substrate 200 (FIG. 19A) or a half-penetration via obtained by affixing the multilayer wiring substrate on which the penetration via is provided with another multilayer wiring substrate (FIG. 19B).

Second, there is a conventional technology for the IVH (FIG. 20A) and the build-up (FIG. 20B) in which the degree of freedom in design is improved while formation of an insulating layer and a conductor layer is performed through a method of photolithography using a resist and a thin film and forming one layer each and interlayer connection is also performed by one layer each.

Third, there is a conventional technology for eliminating the via stab 202a (FIG. 21) by making a hole 203 by using a drill at a part of the multilayer wiring substrate corresponding to the via stab 202a (hereinafter referred to as back drill).

Fourth, there is a conventional technology for providing two through holes in parallel in a conventional multilayer wiring substrate and removing a part of a power source/ground pattern functioning as a return current path of a pattern connecting therebetween (for instance, refer to Japanese Laid-Open Patent Publication No. 2006-140365).

However, in the conventional penetration via, it is necessary to use the entire length of the via as the backbone length. There is a problem of restriction in terms of design that the wiring pattern on the front surface of the multilayer wiring substrate and the wiring pattern on the back surface need to be connected with each other.

Also, in the conventional half-penetration via, after the via is formed on the multilayer wiring substrate, another multilayer wiring substrate needs to be affixed thereto. In the conventional IVH and build-up, the insulating layer and the conductor layer are formed by one layer each, and also the via needs to be formed on each layer. Thus, the number of manufacturing steps is increased. Therefore, there is a problem of restriction in terms of costs that the manufacturing costs are higher than a normal multilayer wiring substrate in which after layers are laminated, a via for penetrating all the layers is formed correctively by using a drill.

In addition, the technology for removing the via stab through the conventional back drill is a process of scraping the unnecessary via stab and it is thus difficult to completely remove the via stab. If the requirement and condition of the transmission characteristics are severe, it is inappropriate to perform the back drill in view of the characteristics and quality. In particular, for a BWB (Back Wiring Board), there is a problem of difficulty for mechanically scraping a minute via stab used for a BGA (Ball Grid Array) which is mounted on a PCB.

Furthermore, in the conventional multilayer wiring substrate, it is necessary to arrange two through holes with respect to one combination for connecting wiring patterns formed on different layers, which leads to an increase in a mounting area of the through holes. Therefore, there is a problem of restriction in design that the area on which the wiring patterns can be formed is narrowed down by the area on which the through holes arranged.

SUMMARY

This invention has been made to solve the above-mentioned problems, and it is an object to provide a multilayer wiring substrate structure having a degree of freedom in wiring design without generating a via stab.

A multilayer wiring substrate having a first and a second layer of one preferred embodiment according to this invention comprises a first wiring pattern formed on the first layer of the multilayer wiring substrate, a second wiring pattern formed on the second layer different from the first layer on which the first wiring pattern is formed, a penetration hole extending from a front surface through a back surface of the multilayer wiring substrate, and a connector comprising an insulator body and a conductor formed on a side surface of the insulator body, the connector being forcibly inserted into the penetration hole so that the conductor contacts the inner surface of the penetration hole, wherein the first wiring pattern and the second wiring pattern are exposed to the inner surface of the penetration hole, and the connector connects both end parts of the conductor part with the respective exposed parts of the first wiring pattern and the second wiring pattern.

According to the present invention, the first wiring pattern formed on an arbitrary one layer of the multilayer wiring substrate, the second wiring pattern formed on a layer different from the layer on which the first wiring pattern is formed, the penetration hole penetrating the front surface and the back surface of the multilayer wiring substrate, and a fitting connector having a conductor part on a side surface inscribed in the penetration hole and fitting into the penetration hole are provided, the first wiring pattern and the second wiring pattern are exposed to the internal surface of the penetration hole, and the fitting connector connects both end parts of the conductor part with the respective exposed parts of the first wiring pattern and the second wiring pattern, whereby it is possible to connect the first wiring pattern and the second wiring pattern without generating the via stab, and it is also possible to provide the multilayer wiring substrate a degree of freedom in wiring design for achieving the high density wirings.

BRIEF DESCRIPTION OF THE DRAWINGS

FIG. 2A is a side view showing an example of a fitting connector in a multilayer wiring substrate structure according to the first embodiment for implementing this invention, and FIG. 2B is a plan view of the fitting connector shown in FIG. 2A;

FIG. 5A is a side view showing an example of a fitting connector in a multilayer wiring substrate structure according to a second embodiment for implementing this invention, and FIG. 5B is a plan view of the fitting connector shown in FIG. 5A;

FIG. 6A is a side view showing another example of the fitting connector in the multilayer wiring substrate structure according to the second embodiment for implementing this invention, and FIG. 6B is a plan view of the fitting connector shown in FIG. 6A;

FIG. 9A is a partially enlarged plan view showing an example of a multilayer wiring substrate in a multilayer wiring substrate structure according to a third embodiment for implementing this invention, and FIG. 9B is a cross-sectional view taken along an arrow B-B line of the multilayer wiring substrate shown in FIG. 9A;

FIG. 10A is a side view showing an example of a fitting connector in a multilayer wiring substrate structure according to the third embodiment for implementing this invention, and FIG. 10B is a plan view of the fitting connector shown in FIG. 10A;

FIG. 12A is a side view showing another example of the fitting connector in the multilayer wiring substrate structure according to the third embodiment for implementing this invention, and FIG. 12B is a plan view of the fitting connector shown in FIG. 12A;

FIG. 13A is a side view showing an example of a rotation controlling jig for positioning the fitting connector shown in FIGS. 12A and 12B to the multilayer wiring substrate, and FIG. 13B is a plan view taken in the direction of arrow A of the fitting connector shown in FIG. 13A;

FIG. 15A is a side view showing still another example of the fitting connector in the multilayer wiring substrate structure according to the third embodiment for implementing this invention, FIG. 15B is a plan view of the fitting connector shown in FIG. 15A;

FIG. 16A is a side view showing an example of a fitting connector in a multilayer wiring substrate structure according to a fourth embodiment for implementing this invention, and FIG. 16B is a plan view of the fitting connector shown in FIG. 16A;

FIG. 19A is a cross-sectional view for describing a penetration via, and FIG. 19B is a cross-sectional view for describing a half-penetration via;

DESCRIPTION OF THE PREFERRED EMBODIMENTS

First Embodiment of the Present Invention

Figure 1A:
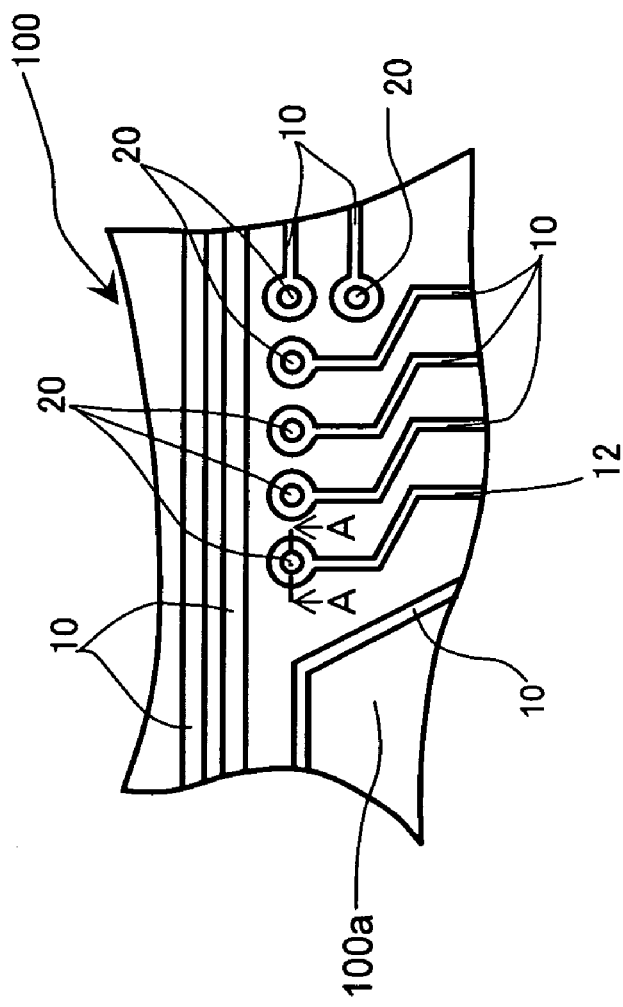
FIG. 1A is a partially enlarged plan view showing an example of a multilayer wiring substrate in a multilayer wiring substrate structure according to a first embodiment for implementing this invention.
Figure 1B:
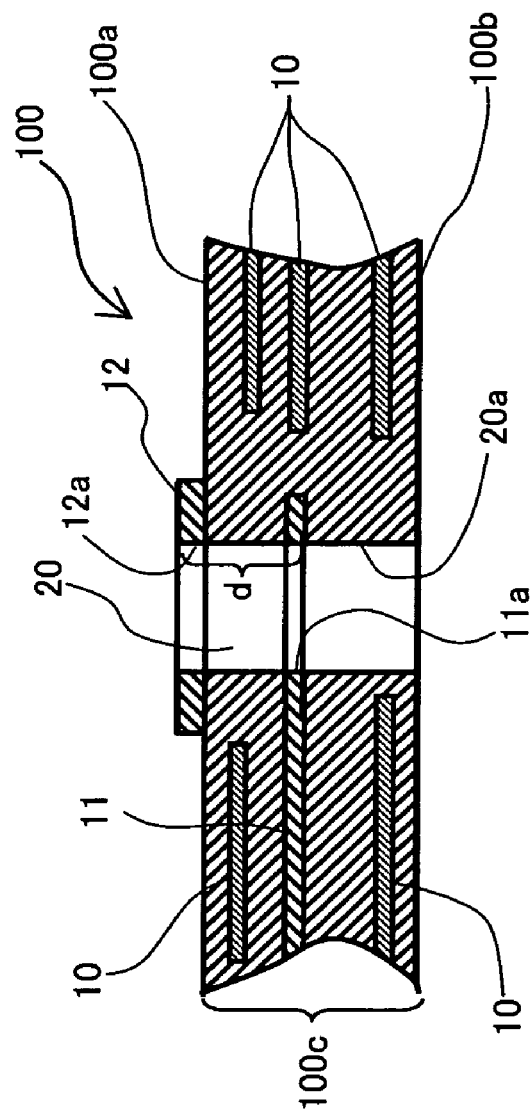
FIG. 1B is a cross-sectional view taken along an arrow A-A line of the multilayer wiring substrate shown in FIG. 1A.
Figure 3:
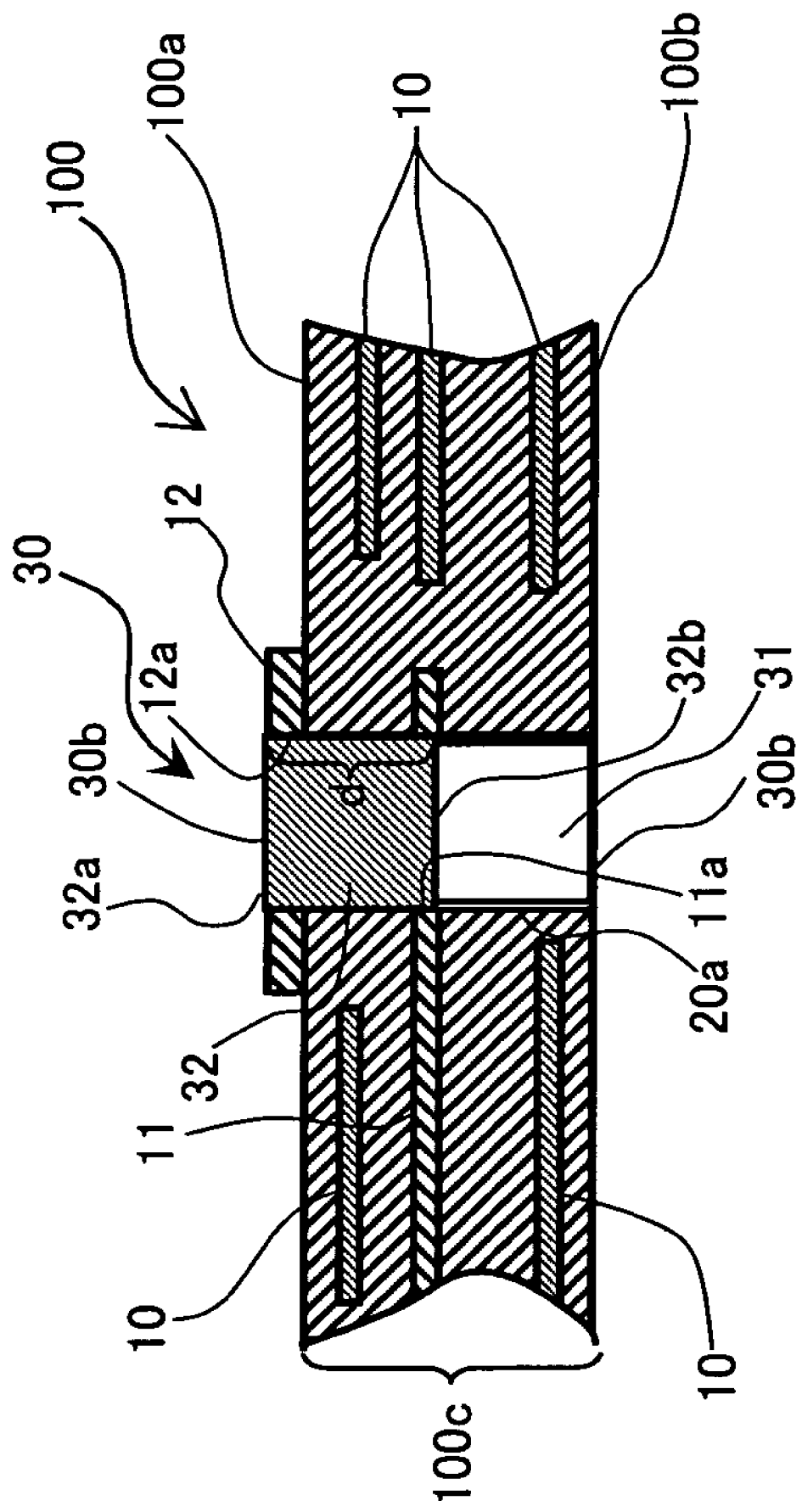
FIG. 3 is a partially enlarged cross-sectional view of a fitting part of the multilayer wiring substrate shown in FIG. 1A with the fitting connector shown in FIGS. 2A and 2B.
Figure 4A:
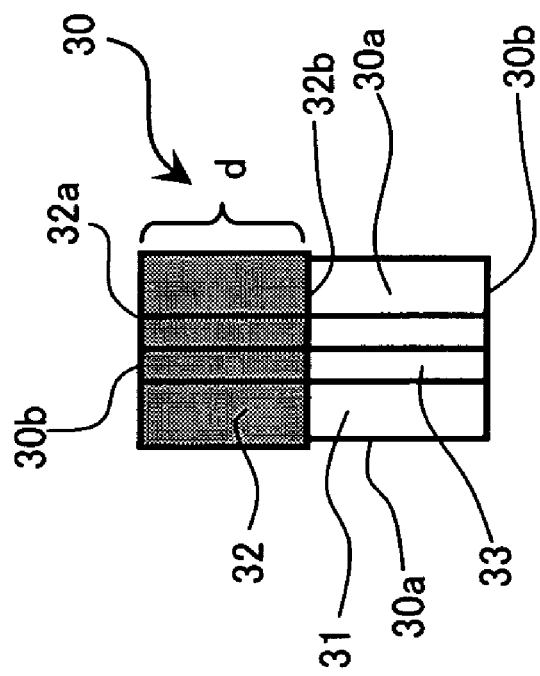
FIG. 4A is a side view showing another example of the fitting connector in the multilayer wiring substrate structure according to the first embodiment for implementing this invention.
Figure 4B:
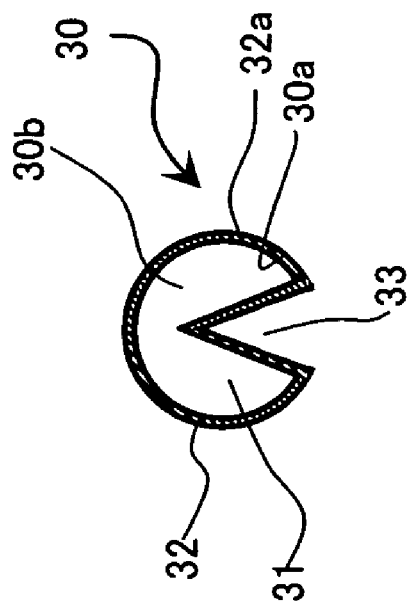
FIG. 4B is a plan view of the fitting connector shown in FIG. 4A.

FIG. 1A is a partially enlarged plan view showing an example of a multilayer wiring substrate in a multilayer wiring substrate structure according to a first embodiment for implementing this invention, FIG. 1B is a cross-sectional view taken along an arrow A-A line of the multilayer wiring substrate shown in FIG. 1A, FIG. 2A is a side view showing an example of a fitting connector in a multilayer wiring substrate structure according to the first embodiment for implementing this invention, FIG. 2B is a plan view of the fitting connector shown in FIG. 2A, FIG. 3 is a partially enlarged cross-sectional view of a fitting part of the multilayer wiring substrate shown in FIG. 1 with the fitting connector shown in FIG. 2, FIG. 4A is a side view showing another example of the fitting connector in the multilayer wiring substrate structure according to the first embodiment for implementing this invention, and FIG. 4B is a plan view of the fitting connector shown in FIG. 4A.

In FIGS. 1 to 4, for a multilayer wiring substrate 100, a paper phenol substrate, a paper epoxy substrate, a glass composite substrate, a glass epoxy substrate, a glass polyimide substrate, a fluorine substrate, a glass PPO (polyphenylene oxide) substrate, a metal substrate, a ceramic substrate or the like can be used. According to this first embodiment, a glass epoxy substrate in which epoxy resin is permeated in a glass woven cloth obtained by weaving glass fibers into a close is used.

The multilayer wiring substrate 100 is composed of a plurality of layers surface 100b, or an internal layer 100c. Hereinafter, a description will be given by way of an example where among the plurality of wiring patterns 10, a first wiring pattern 11 formed on an arbitrary layer of the multilayer wiring substrate 100 and a second wiring pattern 12 formed on a layer different from the layer on which the first wiring pattern 11 is formed (for instance, in FIG. 1B, a front layer) are connected with each other.

A penetration hole 20 is formed substantially in a columnar shape by performing a hole making process on the multilayer wiring substrate 100 using a drill or a laser similarly to a conventional through hole so as to penetrate the front surface 100a and the back surface 100b of the multilayer wiring substrate 100. From the internal surface 20a of the penetration hole 20, a part of the wiring pattern 10 is exposed. An exposed part 11a is exposed from the first wiring pattern 11, and an exposed part 12a is exposed from the second wiring pattern 12.

It should be noted that according to this first embodiment, the shape of the penetration hole 20 is set substantially as the columnar shape, but if the hole making process can provide other shapes, the shape is not limited to this shape. For instance, the shape may be substantially set as rectangular column shape such as a quadrangular prism. In particular, when the shape of the penetration hole 20 is set substantially as the rectangular column shape, the positioning for the penetration hole 20 in a circumferential direction of a fitting connector 30, which will be described later, can be facilitated. However, as the hole making process using the drill is difficult (the corner cannot be formed), it is necessary to perform a laser process in which a process apparatus to be used is more expensive than the drill process. For this reason, it is preferably use the penetration hole 20 substantially having the columnar shape which can be relatively easily processed and in which the manufacturing costs can be suppressed.

The fitting connector 30 has a shape fitting into the penetration hole 20, and according to this first embodiment, the shape is substantially set as the columnar shape to be matched to the penetration hole 20. The fitting connector 30 is composed of an insulator part 31 using an insulating material such as an epoxy resin as a base material and a conductor part 32 obtained by applying a solder paste to a front surface of the insulator part 31 which becomes a side surface 30a of the fitting connector 30. It should be noted that it is preferable to select the same material as the multilayer wiring substrate 100 for a material for the insulator part 31 of the fitting connector 30 because in the same environment, the same change in physical property as the multilayer wiring substrate 100 (the coefficient of expansion, etc.) can be generated.

The conductor part 32 of the fitting connector 30 is arranged around the side surface 30a of the fitting connector 30 so as to have the same width as a distance between the first wiring pattern 11 and the second wiring pattern 12 in a laminating direction of the multilayer wiring substrate 100 (hereinafter referred to as laminating direction distance d). It should be noted that according to this first embodiment, as the second wiring pattern 12 is arranged on a front layer which is the front surface 100a of the multilayer wiring substrate 100, the conductor part 32 is arranged around the side surface 30a of the fitting connector 30 while a rim of one end surface 30b of the fitting connector 30 is set as a first end part 32a of the conductor part 32, and a position away from the first end part 32a by the laminating direction distance d is set as a second end part 32b of the conductor part 32.

With this configuration, in order that the end surface 30b of the fitting connector 30 is set on the same plane surface as the front surface 100a or the back surface 100b of the multilayer wiring substrate 100, by fitting the fitting connector 30 into the penetration hole 20 of the multilayer wiring substrate 100, in the conductor part 32 of the fitting connector 30, the second end part 32b abuts the exposed part 11a of the first wiring pattern 11 and the first end part 32a abuts the exposed part 12a of the second wiring pattern 12. Without generating the via stab, the first wiring pattern 11 can be connected with the second wiring pattern 12. That is, with the exposed part 11a of the first wiring pattern 11 and the exposed part 12a of the second wiring pattern 12 exposing from the penetration hole 20, with respect to the conductor part 32 of the fitting connector 30, the positioning of the fitting connector 30 in the length direction and the circumferential direction can be uniquely performed while the end surface 30b of the fitting connector 30 is set on the same plane surface as the front surface 100a or the back surface 100b of the multilayer wiring substrate 100.

It should be noted that after the fitting connector 30 is inserted into the penetration hole 20 of the multilayer wiring substrate 100 and the positioning is performed, by way of reflow, the fitting connector 30 is fixed to the penetration hole 20 of the multilayer wiring substrate 100 by way of soldering.

Also, in the multilayer wiring substrate 100, in a case where the PWB where the wiring pattern 10 is arranged as the high speed signal transmission path is targeted, the interlayer connection of the wiring pattern 10 for transmitting a signal in which the transmission quality is not significantly regarded is performed through an interlayer connection using an existing plated through hole for the interlayer connection. The interlayer connection of the wiring pattern 10 for transmitting a signal in which the transmission quality of the high speed signal is significantly regarded is performed by using the plated through hole and the fitting connector 30 in combination so that a stab-less interlayer connection by way of the fitting connector 30 according to this first embodiment is realized.

It should be noted that according to this first embodiment, the length of the fitting connector 30 is matched with the thickness of the multilayer wiring substrate 100 (the depth of the penetration hole 20). However, as long as the length of the fitting connector 30 allows the conductor part 32 of the fitting connector 30 to ensure the same width of the laminating direction distance d, the length does not need to be necessarily matched with the multilayer wiring substrate 100.

In addition, according to this first embodiment, in the fitting connector 30, the conductor part 32 is obtained by applying the soldering paste on the surface of the insulator part 31 functioning as the side surface 30a, but a conductor substantially shaped in a column having the same length as the laminating direction distance d may be arranged as the conductor part 32.

As described above, according to this first embodiment, in the first wiring pattern 11 formed on an arbitrary of the multilayer wiring substrate 100 and the second wiring pattern 11 formed on a layer different from the layer on which the first wiring pattern 11 is formed, the fitting connector 30 is fitted into the penetration hole 20 penetrating the front surface 100a and the back surface 100b of the multilayer wiring substrate 100. The exposed part 11a of the first wiring pattern 11 and the exposed part 12a of the second wiring pattern 12 are respectively connected with the first end part 32a and the second end part 32b of the conductor part of the fitting connector 30. Thus, without generating the via stab, the reflection and the transmission loss (the signal attenuation) of the signal transmitting through the first wiring pattern 11 and the second wiring pattern 12 can be suppressed.

Also, according to this first embodiment, the conductor part 32 of the fitting connector 30 has the same width as the laminating direction distance d and is arranged around the side surface of the fitting connector 30. Thus, in a case where the fitting connector 30 is fitted into the penetration hole 20 of the multilayer wiring substrate 100, it is unnecessary to consider about the angle due to the rotation of the fitting connector 30 in the circumferential direction, and the exposed part 11a of the first wiring pattern 11 and the exposed part 12a of the second wiring pattern 12 can be easily respectively connected with the first end part 32a and the second end part 32b of the conductor part 32 of the fitting connector 30.

In addition, according to this first embodiment, as the end surface 30b of the fitting connector 30 is set on the same plane surface as the front surface 100a or the back surface 100b of the multilayer wiring substrate 100, in a case where the fitting connector 30 is fitted into the penetration hole 20 of the multilayer wiring substrate 100, the positioning in the length direction of the fitting connector 30 can be performed. The exposed part 11a of the first wiring pattern 11 and the exposed part 12a of the second wiring pattern 12 can be easily respectively connected with the first end part 32a and the second end part 32b of the conductor part 32 of the fitting connector 30.

It should be noted that according to this first embodiment, the diameter of the both end surface 3b of the fitting connector 30 is matched with the diameter of the penetration hole 20 in the front surface 100a and the back surface 100b of the multilayer wiring substrate 100, and therefore it is considerable that the fitting connector 30 cannot be smoothly inserted into the penetration hole 20 of the multilayer wiring substrate 100 in some cases.

In view of the above, as shown in FIG. 4, the fitting connector 30 uses a flexible insulator as the base material, and the V-shaped groove 33 extending in the length direction of the side surface 30a of the fitting connector 30 is arranged. When the fitting connector 30 is inserted into the penetration hole 20 of the multilayer wiring substrate 100, the insertion is performed in a state where the external shape of the fitting connector 30 is compressed, and thus the fitting connector 30 can be relatively smoothly inserted into the penetration hole 20 of the multilayer wiring substrate 100.

In addition, the V-shaped groove 33 is arranged in the fitting connector 30, and the diameter of the both end surface 3b of the fitting connector 30 is set larger than the diameter of the penetration hole 20 in the front surface 100a and the back surface 100b of the multilayer wiring substrate 100 at a degree, where the fitting connector 30 can be pressed into the penetration hole 20 of the multilayer wiring substrate 100. In a case where the fitting connector 30 is inserted into the penetration hole 20 of the multilayer wiring substrate 100, the fitting connector 30 is released from the compressed state to be expanded, and thus the fitting connector 30 can be engaged with the penetration hole 20 of the multilayer wiring substrate 100.

Second Embodiment of the Present Invention

Figure 7A:
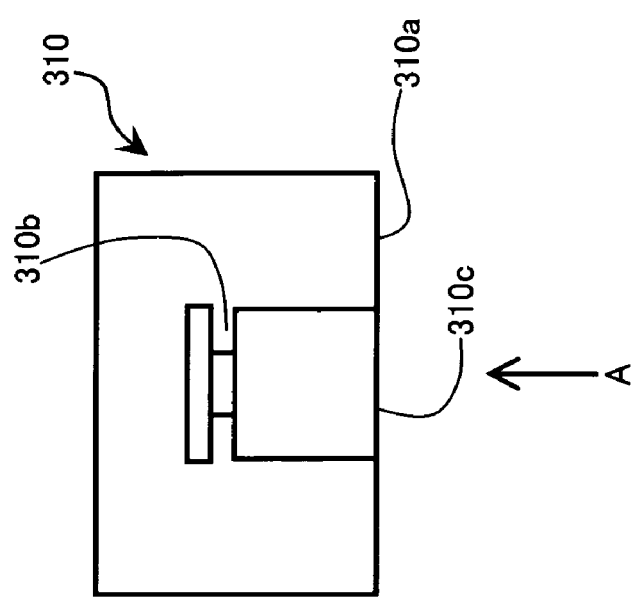
FIG. 7A is a side view showing an example of a connection length controlling jig for positioning the fitting connector shown in FIGS. 6A and 6B to the multilayer wiring substrate.
Figure 7B:
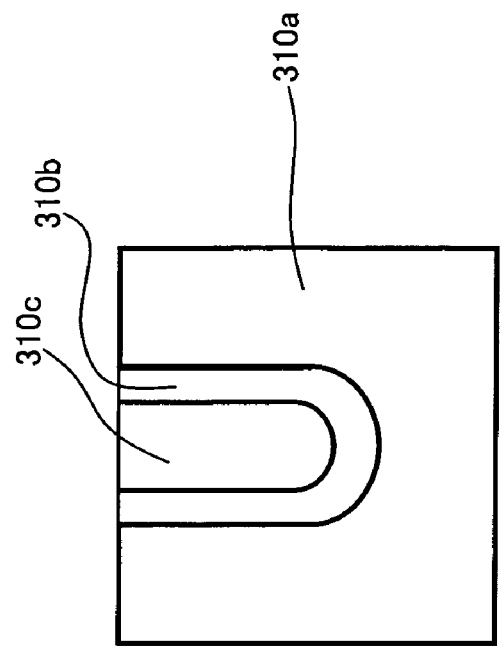
FIG. 7B is a plan view of the jig shown in FIG. 7A.
Figure 8:
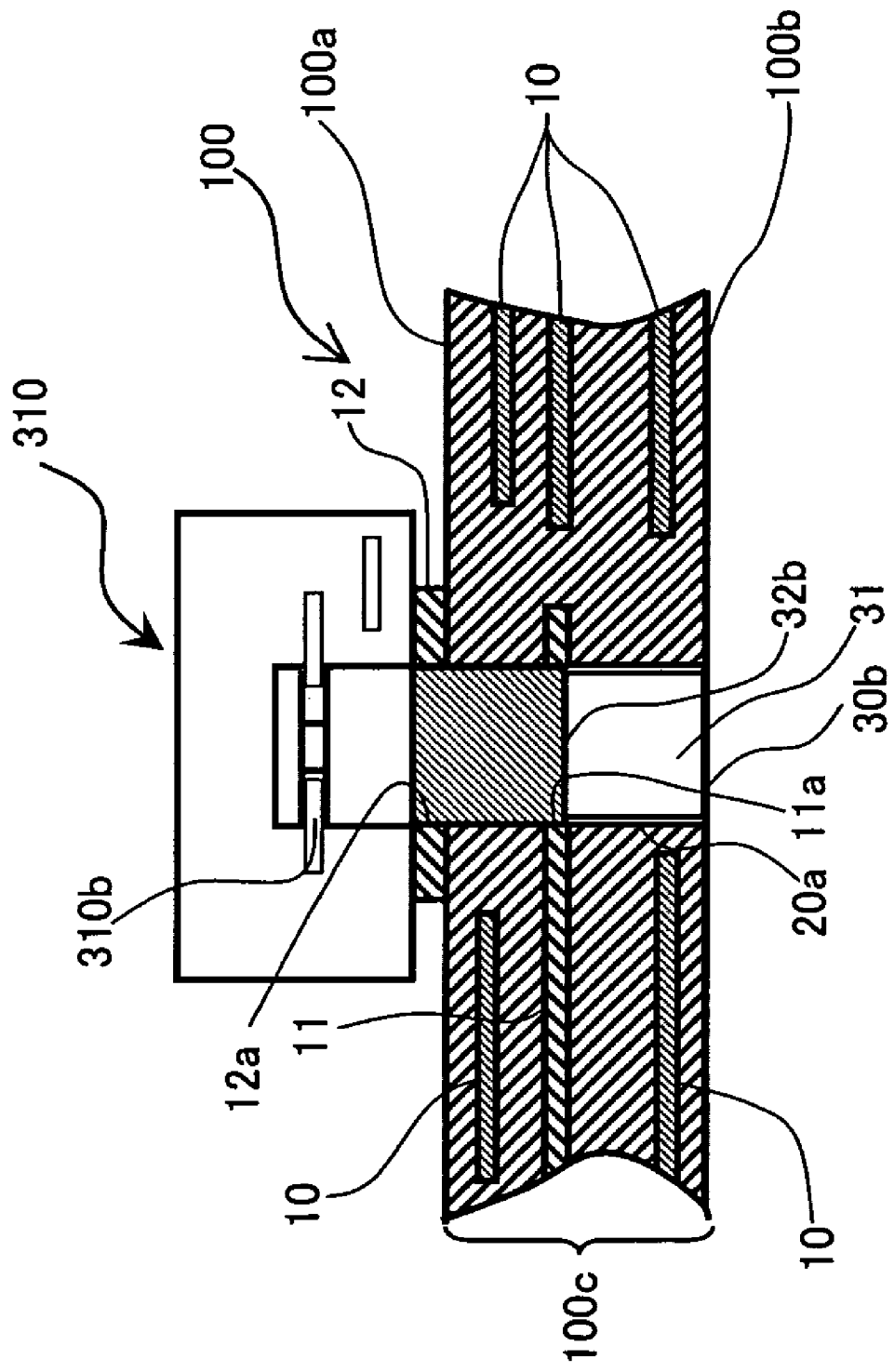
FIG. 8 is an explanatory diagram for describing a use method of the connection length controlling jig shown in FIGS. 7A and B.

FIG. 5A is a side view showing an example of a fitting connector in a multilayer wiring substrate structure according to a second embodiment for implementing this invention, FIG. 5B is a plan view of the fitting connector shown in FIG. 5A, FIG. 6A is a side view showing another example of the fitting connector in the multilayer wiring substrate structure according to the second embodiment for implementing this invention, FIG. 6B is a plan view of the fitting connector shown in FIG. 6A, FIG. 7A is a side view showing an example of a connection length controlling jig for positioning the fitting connector shown in FIG. 6 to the multilayer wiring substrate, FIG. 7B is a plan view of the jig shown in FIG. 7A, and FIG. 8 is an explanatory diagram for describing a use method of a connection length controlling jig shown in FIGS. 7. In FIGS. 5 to 8, the same reference numerals denote the same or equivalent parts as those in FIGS. 1 to 4, and a description thereof will be omitted.

Hereinafter, according to this second embodiment, a description will be given of a case where the fitting connector 30 is fitted into the penetration hole 20 of the multilayer wiring substrate 100 shown in FIG. 1.

The fitting connector 30 has a columnar protrusion unit 34 having a bottom surface whose diameter is larger than the diameter of the penetration hole 20 in the back surface 100b of the multilayer wiring substrate 100 so that the protrusion unit protrudes, from the front surface 100a or the back surface 100b of the multilayer wiring substrate 100 (in this case, the back surface 100b). It should be noted that the protrusion unit 34 is not limited to this shape. Any structure may be adopted as long as one end including one end surface 30b has a length beyond the circumference of the penetration hole 20 from the center of the penetration hole 20 in the front surface 100a or the back surface 100b of the multilayer wiring substrate 100.

Also, in the fitting connector 30, the conductor part 32 is arranged at a corresponding position so that the length from the protrusion unit 34 to the first end part 32a of the conductor part 32 is matched with the depth of the penetration hole 20 from the front surface 100a or the back surface 100b of the multilayer wiring substrate 100 (in this case, the back surface 100b) to the exposed part 12a of the second wiring pattern 12, and the length from the protrusion unit 34 to the second end part 32b of the conductor part 32 is matched to the depth of the penetration hole 20 from the front surface 100a or the back surface 100b of the multilayer wiring substrate 100 (in this case, the back surface 100b) to the exposed part 11a of the first wiring pattern 11.

It should be noted that in the multilayer wiring substrate structure according to this second embodiment, a difference from the first embodiment only resides in that the shape of the fitting connector 30 is changed. The same action and effect as the first embodiment except the action and effect due to the fitting connector 30 which will be described later can be attained.

According to this second embodiment, in a case where the fitting connector 30 is inserted into the penetration hole 20 of the multilayer wiring substrate 100 (in this case, insertion from the back surface 100b of the multilayer wiring substrate 100), the protrusion unit 34 of the fitting connector 30 abuts the front surface 100a or the back surface 100b of the multilayer wiring substrate 100 (in this case, the back surface 100b). An excess insertion amount of the fitting connector 30 with respect to the penetration hole 20 of the multilayer wiring substrate 100 (positional shift of the exposed part 11a of the first wiring pattern 11 and the exposed part 12a of the second wiring pattern 12 with the second end part 32b and the first end part 32a of the conductor part 32 of the fitting connector 30) is prevented, and it is therefore possible to perform the positioning in the length direction of the fitting connector 30 with reliability.

It should be noted that according to this second embodiment, the fitting connector 30 itself is used to perform the positioning in the length direction of the fitting connector 30, but a connection length control jig 310 shown in FIG. 7 may be used.

In this case, the fitting connector 30 includes, as shown in FIGS. 6, a concave part or a convex part on the side surface 30a (in this case, a concave part 35 surrounding the side surface 30b of the fitting connector 30). In addition, in the connection length control jig 310, a bottom surface 310a is a plane surface. The fitting connector 30 can be engaged vertically with the bottom surface 310a, and also the fitting connector 30 includes an engage part 310c provided with the convex part or the concave part (in this case, a convex part 310b) fitting into the concave part or the convex part of the fitting connector 30 (in this case, the concave part 35).

Also, the connection length control jig 310 is configured so that the length of the engage part 310c from the convex part 310b to the bottom surface 310a is matched to a value obtained by subtracting a depth of the penetration hole 20 from the front surface 100a or the back surface 100b of the multilayer wiring substrate 100 (in this case, the front surface 100a) to the exposed part 11a of the first wiring pattern 11 (or the exposed part 12a of the second wiring pattern 12) from the length from the concave part 35 of the fitting connector 30 to the second end part 32b of the conductor part 32 (or the first end part 32a).

It should be noted that the connection length control jig 310 shown in FIG. 7 is described as a dedicated product used in the fitting connector 30 for connecting the particular wiring patterns 10 (in FIG. 8, the wiring pattern 10 on the front layer or the internal layer). In order to realize the versatility, for each of a predetermined interval from the bottom surface 310a of the connection length control jig 310, the connection length control jig 310 may be divided by a surface parallel to the bottom surface 310a, and the divided part may be structured so as to be freely removably inserted. As a result, the length of the connection length control jig 310 from the convex part 310b of the engage part 310c to the bottom surface 310a can be arbitrarily change, and the positioning of the fitting connector 30 can be performed with respect to the wiring patterns 10 formed on various layers.

In addition, according to this second embodiment, the external shape of the connection length control jig 310 is represented in a rectangular parallelepiped, but is not limited to this. Any structure may be adopted as long as at least the bottom surface 310a is a plane surface and the fitting connector 30 can be engaged vertically with respect to the bottom surface 310a at a predetermined length.

Third Embodiment of the Present Invention

Figure 11:
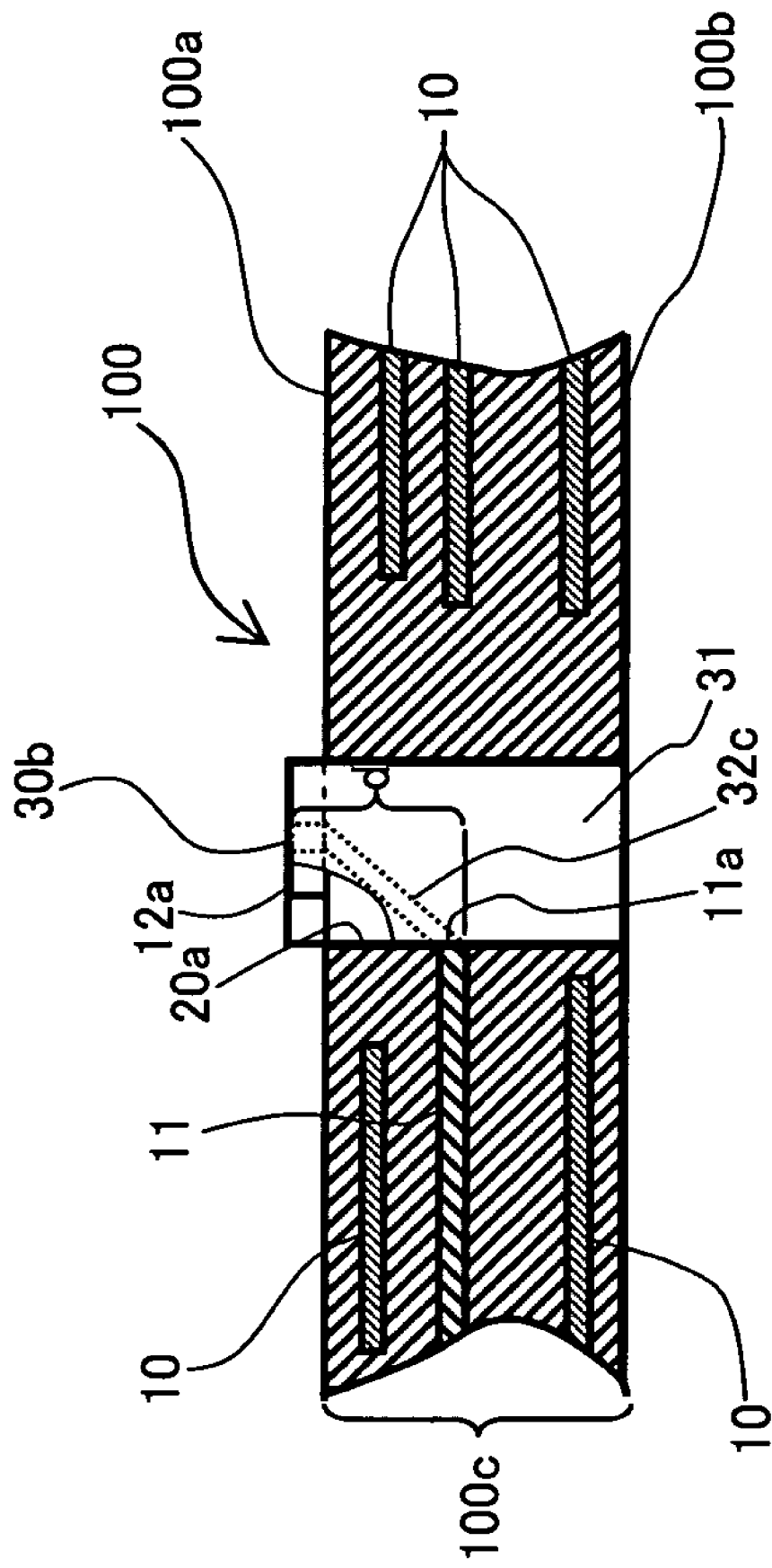
FIG. 11 is a partially enlarged cross-sectional view of a fitting part of the multilayer wiring substrate shown in FIGS. 9A and 9B with the fitting connector shown in FIGS. 10A and 10B.
Figure 14:
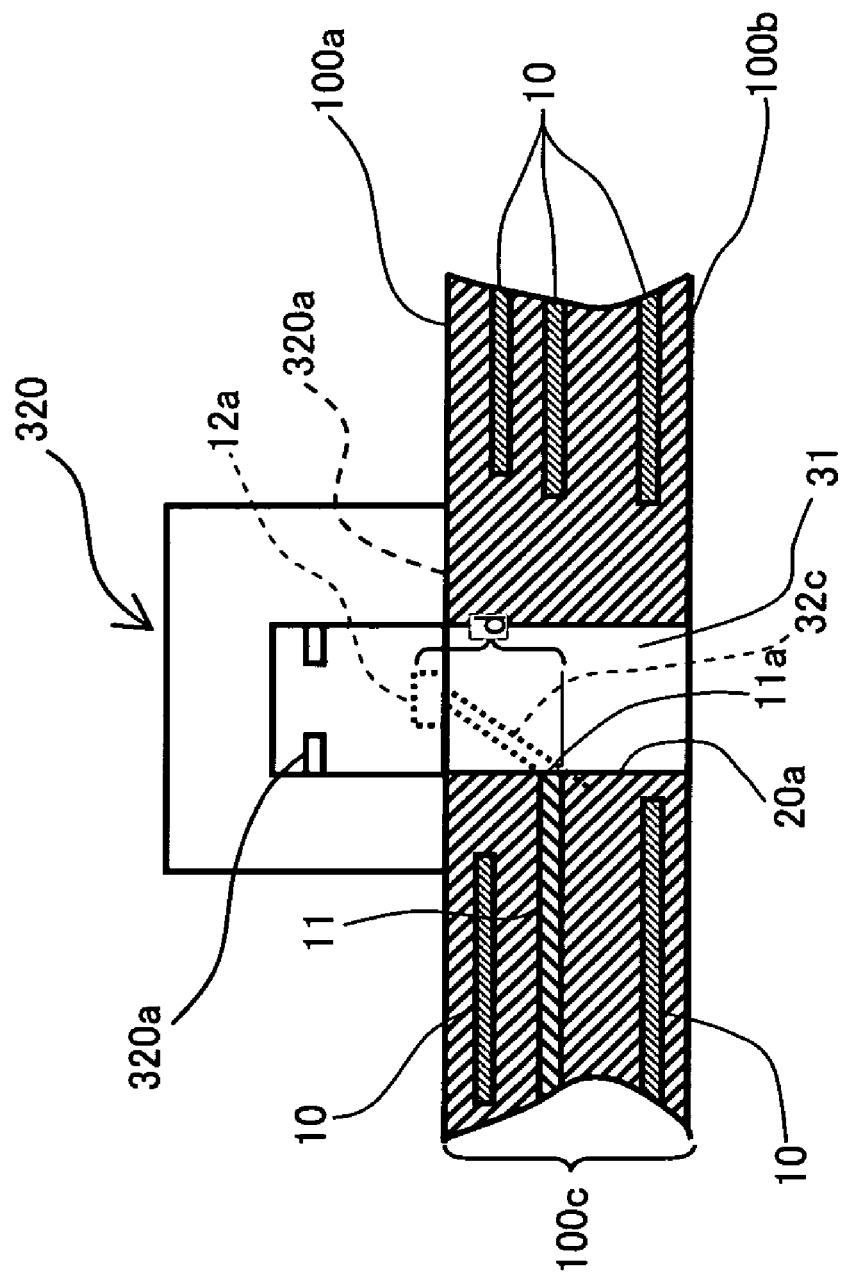
FIG. 14 is an explanatory diagram for describing a use method of the rotation controlling jig shown in FIGS. 13A and 13B.

FIG. 9A is a partially enlarged plan view showing an example of a multilayer wiring substrate in a multilayer wiring substrate structure according to a third embodiment for implementing this invention, FIG. 9B is a cross-sectional view taken along an arrow B-B line of the multilayer wiring substrate shown in FIG. 9A, FIG. 10A is a side view showing an example of a fitting connector in a multilayer wiring substrate structure according to the third embodiment for implementing this invention, FIG. 10B is a plan view of the fitting connector shown in FIG. 10A, FIG. 11 is a partially enlarged cross-sectional view of a fitting part of the multilayer wiring substrate shown in FIG. 9 with the fitting connector shown in FIG. 10, FIG. 12A is a side view showing another example of the fitting connector in the multilayer wiring substrate structure according to the third embodiment for implementing this invention, FIG. 12B is a plan view of the fitting connector shown in FIG. 12A, FIG. 13A is a side view showing an example of a rotation controlling jig for positioning the fitting connector shown in FIG. 12 to the multilayer wiring substrate, FIG. 13B is a plan view of the fitting connector shown in FIG. 13A, FIG. 14 is an explanatory diagram for describing a use method of the rotation controlling jig shown in FIG. 13, FIG. 15A is a side view showing still another example of the fitting connector in the multilayer wiring substrate structure according to the third embodiment for implementing this invention, and FIG. 15B is a plan view of the fitting connector shown in FIG. 15A. In FIGS. 9 to 15, the same reference numerals denote the same or equivalent parts as those in FIGS. 1 to 8, and a description thereof will be omitted.

In the conductor part 32 of the fitting connector 30, in order that the first wiring pattern 11 and the second wiring pattern 12 are connected at the shortest length, the first end part 32a and the second end part 32b having an area where the contact failure between the first wiring pattern 11 and the second wiring pattern 12 is not caused (preferably, substantially having the same shapes as the exposed part 11a of the first wiring pattern 11 and the exposed part 12a of the second wiring pattern 12) are arranged by applying the soldering paste at spots on the side surface 30a, and a straight line part 32c connecting the first end part 32a and the second end part 32b by a straight line is arranged in an internal part 30c. Also, in the fitting connector 30, an alignment mark 36 for checking the rotation angle in the circumferential direction (for instance, a straight groove in FIG. 10B) is arranged on an edge surface 30b.

It should be noted that in the multilayer wiring substrate structure according to this third embodiment, a difference from the first embodiment and the second embodiment resides in that the arrangement of the conductor part 32 of the fitting connector 30 is changed. The same action and effect as the first embodiment and the second embodiment except the action and effect due to the conductor part 32 of the fitting connector 30 which will be described later can be attained.

According to this third embodiment, the conductor part 32 of the fitting connector 30 is composed only of the first end part 32a, the second end part 32b, and the straight line part 32c which connect the first wiring pattern 11 and the second wiring pattern 12 at the shortest length. As compared with the cylindrical or columnar conductor part 32 which can be regarded as the via stab in some cases according to the first embodiment and the second embodiment, the via stab can be further eliminated in a precise sense.

It should be noted that although no consideration needs to be given in the case of the cylindrical or columnar conductor part 32 according to the first embodiment and the second embodiment, the positioning in the circumferential direction of the fitting connector 30 for causing the exposed part 11a of the first wiring pattern 11 and the exposed part 12a of the second wiring pattern 12 to abut the first end part 32a and the second end part 32b of the conductor part 32 of the fitting connector 30 needs to be considered according to this second embodiment.

In view of the above, according to this third embodiment, the fitting connector 30 is rotated in the circumferential direction, and by using the position (direction) indicated by an alignment mark 36 as a target, the first end part 32a and the second end part 32b of the conductor part 32 of the fitting connector 30 can abut the exposed part 11a of the first wiring pattern 11 and the exposed part 12a of the second wiring pattern 12 on the same plane surface.

In addition, for the positioning in the length direction of the fitting connector 30, as in the first embodiment, a method of positioning the end surface 30b of the fitting connector 30 on the same plane surface as the front surface 100a or the back surface 100b of the multilayer wiring substrate 100 and a positioning method using the protrusion unit 34 or the connection length control jig 310 according to the second embodiment are conceivable.

It should be noted that according to this third embodiment, the positioning in the circumferential direction of the fitting connector 30 is performed by identifying the position (direction) indicated by the alignment mark 36 of the fitting connector 30, but a rotation control jig 320 shown in FIG. 13 may be used.

In this case, as shown in FIG. 12, the fitting connector 30 includes the concave part or the convex part which is not set to be surrounded (in this case, the concave part 35a existing only halfway around a the side surface 30b of the fitting connector 30) on the side surface 30a. Also, in the rotation control jig 320, a bottom surface 320a is a plane surface, and the fitting connector 30 can be engaged vertically with the bottom surface 320a. Also, the fitting connector 30 includes an engage part 320c provided with the convex part or the concave part (in this case, the convex part 320b) which is fitted into the concave part or the convex part of the fitting connector 30 (in this case, the concave part 35a).

In addition, the rotation control jig 320 is structured such that the length from the convex part 320b of the engage part 320c to the bottom surface 320a is matched to a value obtained by subtracting a depth of the penetration hole 20 from the front surface 100a or the back surface 100b of the multilayer wiring substrate 100 (in this case, the front surface 100a) to the exposed part 11a of the first wiring pattern 11 (or the exposed part 12a of the second wiring pattern 12) from the length from the concave part 35 of the fitting connector 30a to the second end part 32b of the conductor part 32 (or the first end part 32a). With this structure, with respect to the bottom surface 320c, the rotation control jig 320 can prevent the fitting connector 30 from moving in the length direction and rotating in the circumferential direction. Thus, it is possible to arrange the conductor part 32 of the fitting connector 30 at a predetermined position in the penetration hole 20.

It should be noted that the rotation control jig 320 shown in FIG. 13 is described as a dedicated product used for the fitting connector 30 connecting the particular wiring patterns 10 (in FIG. 14, the wiring patterns 10 on the front layer and the internal layer). In order to realize the versatility, for each of a predetermined interval from the bottom surface 320a of the rotation control jig 320, the rotation control jig 320 may be divided by a surface parallel to the bottom surface 320a, and the divided part may be structured so as to be freely removably inserted. As a result, in the rotation control jig 320, the length from the convex part 320b of the engage part 320c to the bottom surface 320a can be arbitrarily changed. Thus, it is possible to perform the positioning of the fitting connector 30 while corresponding to the wiring patterns 10 formed on the various layers.

Also, according to this third embodiment, in the rotation control jig 320, the external shape is indicated by the rectangular parallelepiped, but is not limited to this shape. Any structure may be adopted as long as at least the bottom surface 320a is a plane surface and the fitting connector 30 can be engaged vertically with the bottom surface 320a at a predetermined length.

In addition, according to this third embodiment, the description has been given of the case in which the first wiring pattern 11 and the second wiring pattern 12 are connected on a 1 on 1 basis which is general in the high speed signal transmission path. In a case where a low speed signal transmission path in which the wiring may be branched, the plurality of wiring patterns 10 may be connected with the first wiring pattern 11 or the second wiring pattern 12 via the fitting connector 30.

Also, according to this third embodiment, the description has been given of the case in which the single conductor part 32 is arranged with respect to the single fitting connector 30 and a pair of the wiring patterns 10 (the first wiring pattern 11 and the second wiring pattern 12) are connected, but the plural conductor parts 32 are arranged with respect to the single fitting connector 30 to be used for interlayer connection of plural pairs.

Furthermore, according to this third embodiment, the plural fitting connectors 30 are respectively independent and fitted into the corresponding penetration holes 20, but such a structure may be adopted that the plural fitting connectors 30 are coupled and fitted into the plural penetration holes 20 as a unit. As a result, the fitting connectors 30 are prevented from rotating in the circumferential direction with use of the other coupled fitting connectors 30 and it is possible to perform the positioning in the circumferential direction of the fitting connector 30. Also, the coupling parts abut the front surface 100a or the back surface 100b of the multilayer wiring substrate 100. Thus, the excess insertion amount of the fitting connector 30 with respect to the penetration hole 20 of the multilayer wiring substrate 100 is prevented and it is possible to perform the positioning in the length direction of the fitting connector 30.

In particular, in a case where the plural high speed signal transmission paths such as differential pair wirings and bus wirings are arranged in parallel, which is a transmission mode frequently used for high speed signals, the first wiring pattern 11 and the second wiring pattern 12 are the wiring pattern group where the plurality of wiring patterns 10 is arranged in parallel. The corresponding plural fitting connectors 30 are coupled to the respective wiring patterns 10 in this wiring pattern group and fitted into the plural penetration holes 20 as a unit. For example, as shown in FIGS. 15, such a structure is conceivable that in the two fitting connectors 30, the straight line parts 32c of the conductor parts 32 are arranged in parallel, and the fitting connectors 30 are coupled by a coupling part 37.

Fourth Embodiment of the Present Invention

FIG. 16A is a side view showing an example of a fitting connector in a multilayer wiring substrate structure according to a fourth embodiment for implementing this invention, and FIG. 16B is a plan view of the fitting connector shown in FIG. 16A. In FIG. 16, the same reference numerals denote the same or equivalent parts as those in FIGS. 1 to 15, and a description thereof will be omitted.

The fitting connector 30 includes a general use wiring concave part 38 in which the plural concave parts 38a along with the length direction and the plural concave parts 38b in the circumferential direction are combined on the side surface 30a, and the conductor part 32 is embedded at a predetermined position of the general use wiring concave part 38.

In the conductor part 32, such a structured may be conceivable that among the universal wiring concave parts 38, a conductor components on which the soldering paste is applied by the spots or the soldering paste is attached at a segment optimal for the interlayer connection (for instance, a shortest distance route or a route where other wirings are considered) is fitted into the general use wiring concave part 38.

It should be noted that in the multilayer wiring substrate structure according to this fourth embodiment, a difference from the first embodiment, the second embodiment, and the third embodiment only resides in that the general use wiring concave part 38 is provided on the side surface of the fitting connector 30 and the conductor part 32 is embedded at the predetermined position. The same action and effect as the first embodiment, the second embodiment, and the third embodiment are attained except the action and effect due to the general use wiring concave part 38 of the fitting connector 30 which will be described below.

According to this fourth embodiment, in the via of the conventional multilayer wiring substrate, the soldering paste can be used for the interlayer connection where it is impossible to physically provide a plurality of wirings, thus achieving the improvement in the high density wiring rate.

EXAMPLES

Next, the high speed signal transmission path using the conventional multilayer wiring substrate where the via stab is generated is compared with the high speed signal transmission path using the multilayer wiring substrate structure according to the present invention to validate the action and effect of the present invention.

Regarding the high speed signal transmission path used for the validation, such a case is considered that in the multilayer wiring substrate of the layer structure shown in the following Table 1, the wiring pattern arranged on the 18th layer (the conductor width: 100 μm) and the wiring pattern arranged on the 20th layer which is the front layer (the conductor width: 175 μm) are connected using the via according to the conventional technique or the fitting connector 30 according to the present invention. It should be noted that upon using the via and the fitting connector 30, such a case is considered that the through hole and the penetration hole 20 having the land diameter of 0.5 mm, the drill diameter of 0.25 mm, and the recess diameter of 0.75 mm penetrates through the multilayer wiring substrate of the layer structure shown in the following Table 1. In the Table 1, Thickness is thickness of each layer or electro conductor, $\epsilon_r$ is relative dielectric constant, tanδ is dielectric dissipation, Dp is irradiation direction of ultraviolet rays (for example, in a process of forming electro conductive layer of the $1^{st}$ signal layer, ultraviolet rays is irradiated in a direction toward to $1^{st}$ insulating layer.), $L_d$ is a increased amount at the edge of conductor surface, which are not adhered to an insulating layer, in process of forming the conductor pattern, ρ is volume resistivity.

TABLE 1

| # | Type of layer | Thickness | $\epsilon_r$ | tan δ | $D_p$ | $L_d$ | ρ |
|---|---|---|---|---|---|---|---|
| | resist layer | 40.000 μm | 3.800 | 0.005000 | — | — | — |
| $1^{st}$ | signal layer | 18.000 | — | — | ↓↓ | 10.000 μm | 2.09e$^{-8}$ |
| | insulating layer | 100.000 | 3.800 | 0.005000 | — | — | — |
| $2^{nd}$ | POW/GND layer | 18.000 | — | — | ↓↓ | 10.000 | 2.09e$^{-8}$ |
| | insulating layer | 100.000 | 3.800 | 0.005000 | — | — | — |
| $3^{rd}$ | signal layer | 18.000 | — | — | ↑↑ | 10.000 | 2.09e$^{-8}$ |
| | insulating layer | 120.000 | 3.800 | 0.005000 | — | — | — |
| $4^{th}$ | POW/GND layer | 18.000 | — | — | ↓↓ | 10.000 | 2.09e$^{-8}$ |
| | insulating layer | 100.000 | 3.800 | 0.005000 | — | — | — |

TABLE 1-continued

| # | Type of layer | Thickness | $\epsilon_r$ | tan δ | $D_p$ | $L_d$ | ρ |
|---|---|---|---|---|---|---|---|
| 5th | signal layer | 18.000 | — | — | ↑↑ | 10.000 | $2.09e^{-8}$ |
| | insulating layer | 120.000 | 3.800 | 0.005000 | — | — | — |
| 6th | POW/GND layer | 18.000 | — | — | ↓↓ | 10.000 | $2.09e^{-8}$ |
| | insulating layer | 100.000 | 3.800 | 0.005000 | — | — | — |
| 7th | signal layer | 18.000 | — | — | ↑↑ | 10.000 | $2.09e^{-8}$ |
| | insulating layer | 120.000 | 3.800 | 0.005000 | — | — | — |
| 8th | POW/GND layer | 18.000 | — | — | ↓↓ | 10.000 | $2.09e^{-8}$ |
| | insulating layer | 100.000 | 3.800 | 0.005000 | — | — | — |
| 9th | signal layer | 18.000 | — | — | ↑↑ | 10.000 | $2.09e^{-8}$ |
| | insulating layer | 120.000 | 3.800 | 0.005000 | — | — | — |
| 10th | POW/GND layer | 18.000 | — | — | ↓↓ | 10.000 | $2.09e^{-8}$ |
| | insulating layer | 100.000 | 3.800 | 0.005000 | — | — | — |
| 11th | POW/GND layer | 18.000 | — | — | ↑↑ | 10.000 | $2.09e^{-8}$ |
| | insulating layer | 120.000 | 3.800 | 0.005000 | — | — | — |
| 12th | signal layer | 18.000 | — | — | ↓↓ | 10.000 | $2.09e^{-8}$ |
| | insulating layer | 100.000 | 3.800 | 0.005000 | — | — | — |
| 13th | POW/GND layer | 18.000 | — | — | ↑↑ | 10.000 | $2.09e^{-8}$ |
| | insulating layer | 120.000 | 3.800 | 0.005000 | — | — | — |
| 14th | signal layer | 18.000 | — | — | ↓↓ | 10.000 | $2.09e^{-8}$ |
| | insulating layer | 100.000 | 3.800 | 0.005000 | — | — | — |
| 15th | POW/GND layer | 18.000 | — | — | ↑↑ | 10.000 | $2.09e^{-8}$ |
| | insulating layer | 120.000 | 3.800 | 0.005000 | — | — | — |
| 16th | signal layer | 18.000 | — | — | ↓↓ | 10.000 | $2.09e^{-8}$ |
| | insulating layer | 100.000 | 3.800 | 0.005000 | — | — | — |
| 17th | POW/GND layer | 18.000 | — | — | ↑↑ | 10.000 | $2.09e^{-8}$ |
| | insulating layer | 120.000 | 3.800 | 0.005000 | — | — | — |
| 18th | signal layer | 18.000 | — | — | ↓↓ | 10.000 | $2.09e^{-8}$ |
| | insulating layer | 100.000 | 3.800 | 0.005000 | — | — | — |
| 19th | POW/GND layer | 18.000 | — | — | ↑↑ | 10.000 | $2.09e^{-8}$ |
| | insulating layer | 100.000 | 3.800 | 0.005000 | — | — | — |
| 20th | signal layer | 18.000 | — | — | ↑↑ | 10.000 | $2.09e^{-8}$ |
| | resist layer | 40.000 | 3.800 | 0.005000 | — | — | — |

According to Example 1 for the multilayer wiring substrate structure of the present invention, the backbone length is 254 μm and the branch length is 0 μm. Also, according to Comparative Example 1 for the conventional technique multilayer wiring substrate on which the processing using the back drill is not performed, the backbone length is 254 μm and the branch length is 2166 μm. Also, according to Comparative Example 2 for the conventional technique multilayer wiring substrate on which the processing using the back drill is performed, the backbone length is 254 μm and the branch length is 138 μm. It should be noted that it is currently difficult to perform the processing using the back drill on a minute via having the diameter of 0.25 mm (a via which is formed through a laser and has the diameter equal to or smaller than 0.3 mm) in this example. Therefore, it is assumed that the processing using the back drill can be performed, a simulation is executed in a case where the extremely small via stab is left (for instance, the processing using the back drill can be performed immediately before the 17th layer).

Figure 17A:
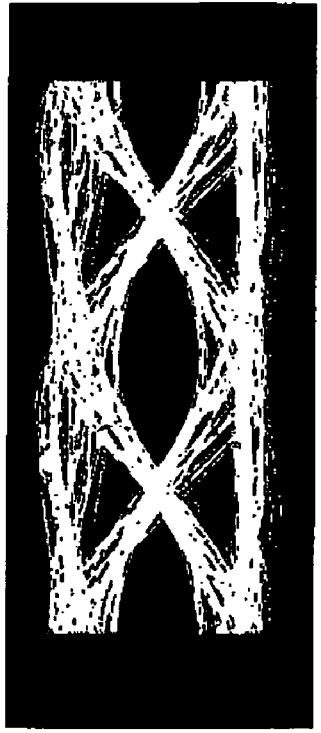
FIG. 17A is a waveform chart showing an eye diagram in Example 1.
Figure 17B:
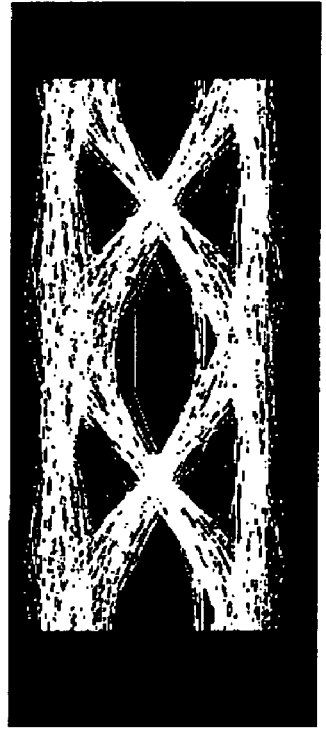
FIG. 17B is a waveform chart showing an eye diagram in Comparative Example 1.
Figure 17C:
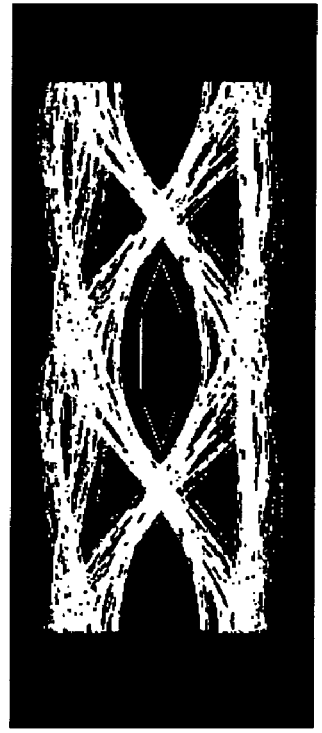
FIG. 17C is a waveform chart showing an eye diagram in Comparative Example 2.
Figure 18A:
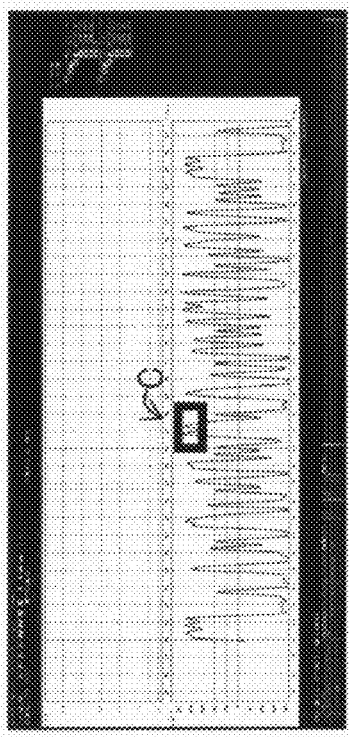
FIG. 18A is a waveform chart for comparing the signal transmissions in Example 1 and Comparative Example 2.
Figure 18B:
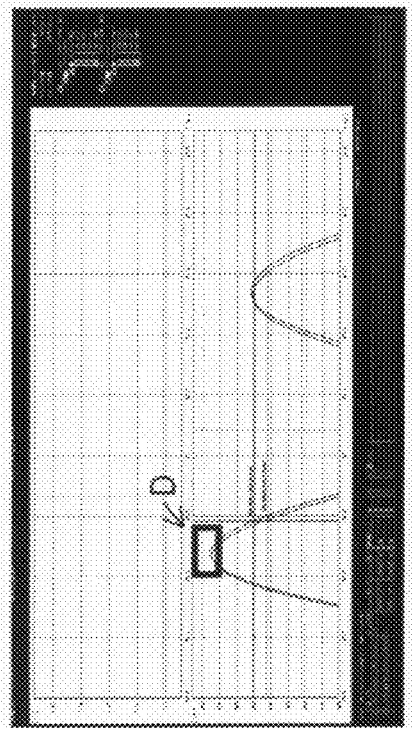
FIG. 18B is an enlarged diagram of an enlarge part C shown in FIG. 18A.
Figure 18C:
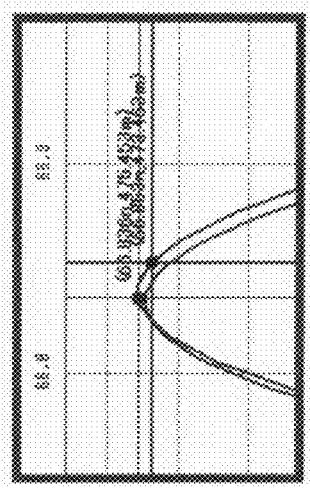
FIG. 18C is an enlarged diagram of an enlarge part D shown in FIG. 18B.
Figure 20A:
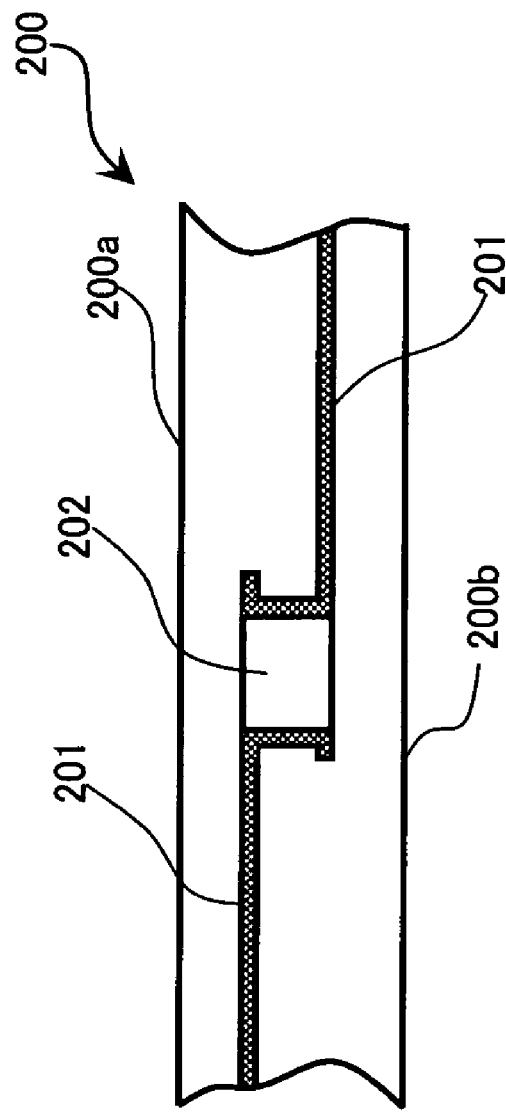
FIG. 20A is a cross-sectional view for describing the IVH.
Figure 20B:
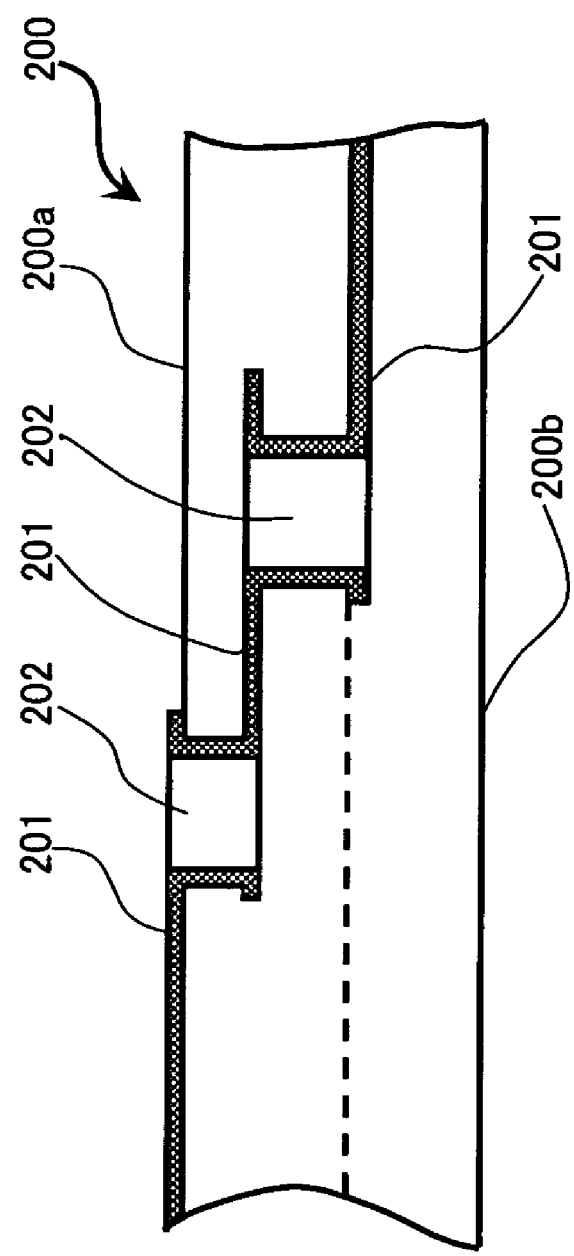
FIG. 20B is a cross-sectional view for describing the build-up.
Figure 21A:
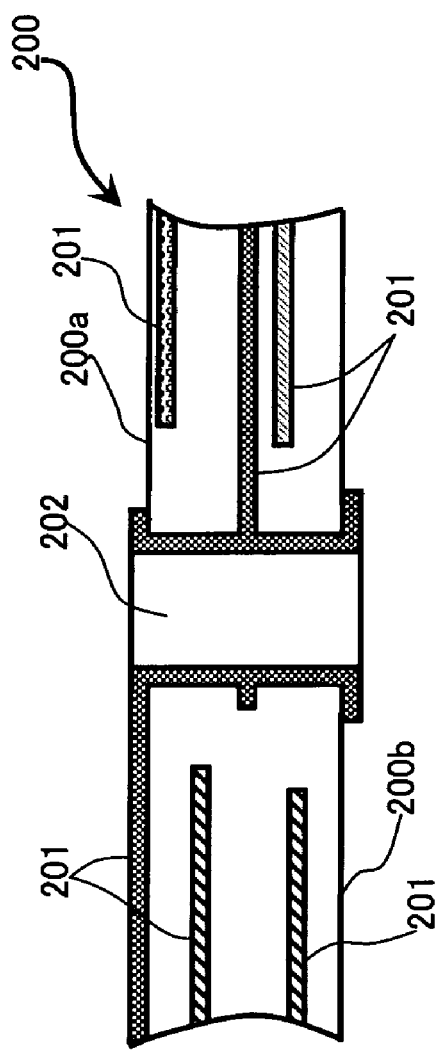
FIG. 21A is a cross-sectional view for describing a back drill before the back drill is performed.
Figure 21B:
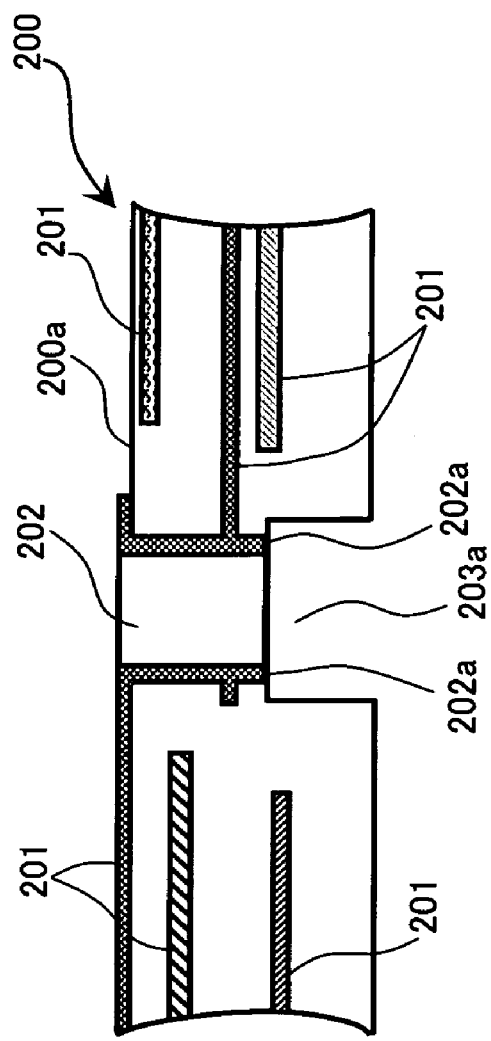
FIG. 21B is a cross-sectional view for describing the back drill after the back drill is performed.

The high speed signals whose transmission speed is 4.8 Gbps are transmitted and measured signal waveforms are shown in FIGS. 17 and 18 according to Example 1, Comparative Example 1, and Comparative Example 2. FIG. 17A is a waveform chart showing an eye diagram in Example 1, FIG. 17B is a waveform chart showing an eye diagram in Comparative Example 1, and FIG. 17C is a waveform chart showing an eye diagram in Comparative Example 2, FIG. 18A is a waveform chart for comparing the signal transmissions in Example 1 and Comparative Example 2, FIG. 18B is an enlarged diagram of an enlarge part C shown in FIG. 18A, and FIG. 18C is an enlarged diagram of an enlarge part D shown in FIG. 18B.

When the signal is evaluated by using the eye diagram shown in FIG. 17, the opening conditions of the eyes according to Example 1 and Comparative Example 2 are substantially equal to each other. When comparing Example 1 is compared with Comparative Example 1, it is understood that the opening condition of the eye is large. As a result, it is understood that Example 1 provides a satisfactory signal which is close to an ideal waveform as compared with Comparative Example 1. It should be noted that the opening conditions of the eyes according to Example 1 and Comparative Example 2 are substantially equal to each other, but Comparative Example 2 is the simulation result while it is assumed that the processing using the back drill can be performed. When Comparative Example 1 is considered, it is understood that an effect is caused on the signal transmission depending on the branch length of the via stab.

In addition, according to the signal waveform shown in FIGS. 18, in Comparative Example 2, it is understood that an overshoot (OS) is larger by 1.99 mV and the a propagation delay time (Td) is larger by 8 ps than those in Example 1. Thus, it is understood that even the extremely small via stab affects the signal transmission.

What is claimed is:

1. A multilayer wiring substrate having a first and a second layer comprising:
    a first wiring pattern formed on the first layer of the multilayer wiring substrate;
    a second wiring pattern formed on the second layer different from the first layer on which the first wiring pattern is formed;
    a penetration hole extending from a front surface through a back surface of the multilayer wiring substrate; and
    a connector comprising an insulator body and a conductor formed on a part of a side surface of the insulator body, the connector being forcibly inserted into the penetration hole so that the conductor contacts the inner surface of the penetration hole, wherein the first wiring pattern and the second wiring pattern are exposed to the inner surface of the penetration hole, and the connector connects both end parts of the conductor part with the respective exposed parts of the first wiring pattern and the second wiring pattern.

2. The multilayer wiring substrate according to claim 1, wherein the conductor of the connector has the same width as an interval between the first wiring pattern and the second wiring pattern in a laminating direction of the multilayer wiring substrate.

3. The multilayer wiring substrate according to claim 1, wherein the conductor of the connector is arranged inside the connector in such a manner that the first wiring pattern and the second wiring pattern are connected at the shortest length.

4. The multilayer wiring substrate according to claim 1, wherein an end surface of the connector is on a same place as the front surface or the back surface of the multilayer wiring substrate.

5. The multilayer wiring substrate according to claim 1, wherein the connector has a protrusion part protruding from the front surface or the back surface of the multilayer wiring substrate, and the protrusion part of the connector abuts the front surface or the back surface of the multilayer wiring substrate.

6. The multilayer wiring substrate according to claim 1, wherein the first wiring pattern and the second wiring pattern are a parallel pattern group in which the plurality of wiring patterns are arranged in parallel, and the plurality of fitting connectors corresponding to the wiring patterns of the parallel pattern group are coupled and fitted into the plural penetration holes as a unit.

7. A multilayer wiring substrate having a first and a second layer comprising:
  a first wiring pattern formed on the first layer of the multilayer wiring substrate;
  a second wiring pattern formed on the second layer different from the first layer on which the first wiring pattern is formed;
  a penetration hole extending from a front surface through a back surface of the multilayer wiring substrate; and
  a connector comprising an insulator body and a conductor formed on a side surface of the insulator body, the connector being forcibly inserted into the penetration hole so that the conductor contacts the inner surface of the penetration hole,
  wherein the first wiring pattern and the second wiring pattern are exposed to the inner surface of the penetration hole, and the connector connects both end parts of the conductor part with the respective exposed parts of the first wiring pattern and the second wiring pattern, and
  wherein the connector includes a universal wiring concave part in which a plurality of concave parts along a length direction and a plurality of concave parts along a circumferential direction are combined on the side surface, and the conductor is embedded in a predetermined position of the universal wiring concave part.

8. A multilayer wiring substrate having a first and a second layer comprising:
  a first wiring pattern formed on the first layer of the multilayer wiring substrate;
  a second wiring pattern formed on the second layer different from the first layer on which the first wiring pattern is formed;
  a penetration hole extending from a front surface through a back surface of the multilayer wiring substrate; and
  a connector comprising an insulator body and a conductor formed on a side surface of the insulator body, the connector being forcibly inserted into the penetration hole so that the conductor contacts the inner surface of the penetration hole,
  wherein the first wiring pattern and the second wiring pattern are exposed to the inner surface of the penetration hole, and the connector connects both end parts of the conductor part with the respective exposed parts of the first wiring pattern and the second wiring pattern, and
  wherein the connector includes a flexible insulator as a base material and has a V-shaped groove extending in the length direction arranged on the side surface.

* * * * *